United States Patent [19]

Glavish

[11] Patent Number: 5,311,028

[45] Date of Patent: May 10, 1994

[54] SYSTEM AND METHOD FOR PRODUCING OSCILLATING MAGNETIC FIELDS IN WORKING GAPS USEFUL FOR IRRADIATING A SURFACE WITH ATOMIC AND MOLECULAR IONS

[75] Inventor: Hilton F. Glavish, Incline Village, Nev.

[73] Assignee: Nissin Electric Co., Ltd., Kyoto, Japan

[21] Appl. No.: 843,391

[22] Filed: Feb. 28, 1992

Related U.S. Application Data

[63] Continuation-in-part of Ser. No. 575,498, Aug. 29, 1990, Pat. No. 5,132,544.

[51] Int. Cl.$^5$ .................... H01J 37/302; H01J 37/317
[52] U.S. Cl. ...................... 250/492.21; 250/396 ML; 250/398
[58] Field of Search .......... 250/396 ML, 398, 396 R, 250/492.21, 492.3; 335/210, 213

[56] References Cited

U.S. PATENT DOCUMENTS

| | | |
|---|---|---|
| 2,260,725 | 10/1941 | Richards et al. . |
| 3,671,895 | 6/1972 | Aucouturier et al. . |
| 3,707,628 | 12/1972 | Bassett et al. . |
| 3,778,626 | 12/1973 | Robertson . |
| 3,859,557 | 1/1975 | Grant et al. . |
| 3,867,635 | 2/1975 | Brown et al. . |

(List continued on next page.)

FOREIGN PATENT DOCUMENTS

WO87/06391 10/1987 PCT Int'l Appl. .

OTHER PUBLICATIONS

M. A. Guerra, *Materials Science and Engineering*, "Development of Second Generation Oxygen Implanter" B12 (1992), pp. 145–148.

(List continued on next page.)

*Primary Examiner*—Jack I. Berman
*Attorney, Agent, or Firm*—Fish & Richardson

[57] ABSTRACT

Deflection apparatus is shown for high perveance ion beams, operating at 20 Hz fundamental and substantially higher order harmonics, having a magnetic structure formed of laminations with thickness in range between 0.2 and 1 millimeter. Additionally, a compensator is shown with similar laminated structures with resonant excitation circuit, operating at 20 Hz or higher, in phase locked relationship with the frequency of the previously deflected beam. Furthermore, features are shown which have broader applicability to producing strong magnetic field in magnetic gap. Among the numerous important features shown are special laminated magnetic structures, including different sets of crosswise laminations in which the field in one lamination of one set is distributed into multiplicity of laminations of the other set of coil-form structures, field detection means and feedback control system, cooling plate attached in thermal contact with number of lamination layers. Surfaces on the entry and exit sides of the compensator magnetic structure have cooperatively selected shapes to increase the length of path exposed to the force field dependently with deflection angle to compensate for contribution to deflection angle caused by higher order components. The entry and exit surfaces of the magnetic scanner and compensator structures cooperating to produce desired beam profile and desired limit on angular deviation of ions within the beam. Also shown is an accelerator comprising a set of accelerator electrodes having slotted apertures, a suppressor electrode at the exit of the electrostatic accelerator, a post-accelerator analyzer magnet having means for adjusting the angle of incidence by laterally moving the post-accelerator analyzer magnet, and a magnet to eliminate aberration created by the post-accelerator analyzer magnet. In the case of use of a spinning substrate carrier for scanning in one dimension, the excitation wave form of the scanner relates changes in scan velocity in inverse dependence with changes in the radial distance of an implant point from the rotation axis. Also an oxygen implantation method is shown with 50 mA ion beam current, the ion beam energy above 100 KeV, and the angular velocity of a rotating carrier above 50 rpm.

35 Claims, 21 Drawing Sheets

U.S. PATENT DOCUMENTS

| | | |
|---|---|---|
| 4,063,098 | 12/1977 | Enge . |
| 4,140,913 | 2/1979 | Anger et al. . |
| 4,191,887 | 3/1980 | Brown . |
| 4,258,266 | 3/1981 | Robinson et al. . |
| 4,335,309 | 6/1982 | Anger et al. . |
| 4,367,411 | 1/1983 | Hanley et al. . |
| 4,376,477 | 6/1981 | Enge . |
| 4,379,231 | 4/1983 | Shii et al. . |
| 4,380,703 | 4/1983 | Schmitt . |
| 4,409,486 | 10/1983 | Bates . |
| 4,417,145 | 11/1983 | Norioka . |
| 4,455,489 | 6/1984 | Brown . |
| 4,469,948 | 9/1984 | Veneklasen et al. ............... 250/396 |
| 4,494,005 | 1/1985 | Shibata et al. ..................... 250/492 |
| 4,533,831 | 8/1985 | Itoh et al. ........................... 250/492 |
| 4,544,847 | 10/1985 | Taylor . |
| 4,564,763 | 1/1986 | Bruel et al. ......................... 250/396 |
| 4,590,379 | 5/1986 | Martin . |
| 4,633,138 | 12/1986 | Tokiguchi et al. ................. 315/111 |
| 4,634,931 | 1/1987 | Taya et al. .......................... 315/111 |
| 4,661,712 | 4/1987 | Mobley . |
| 4,687,936 | 8/1987 | McIntyre et al. ................... 250/397 |
| 4,726,046 | 2/1988 | Nunan ................................... 378/65 |
| 4,736,106 | 4/1988 | Kashy et al. ........................ 250/396 |
| 4,745,281 | 5/1988 | Enge ............................... 250/396 R |
| 4,775,796 | 10/1988 | Purser et al. ....................... 250/492 |
| 4,785,188 | 11/1988 | Mori et al. .......................... 250/492 |
| 4,801,847 | 1/1989 | Sakudo et al. ...................... 315/541 |
| 4,804,852 | 2/1989 | Rose et al. .......................... 250/492 |
| 4,804,879 | 2/1989 | Fukumoto ........................... 313/361 |
| 4,922,106 | 5/1990 | Berrian et al. .................... 250/492.2 |
| 4,980,562 | 12/1990 | Berrian et al. .................... 250/492.2 |
| 5,012,104 | 4/1991 | Young . |
| 5,053,627 | 10/1991 | Riffell et al. .................... 250/492.21 |
| 5,132,544 | 7/1992 | Glavish . |

OTHER PUBLICATIONS

J. H. Freeman, British publication dated Jan. 1970 entitled "A Variable Geometry Separator and Low Energy Heavy Ion Accelerator".

J. H. Freeman, British publicated dated Aug. 1970 entitled "Stigmatic Focusing Effects in a Variable Geometry Isotope Separator".

Allison, Jr. et al., "Design and Performance of High Current 200 KeV Electrostatically Scanned Ion Implantation Accelerator", P. 482–489, in Proc. of Sym. on Electron & Ion Beam Sci. & Tech. 7th Int'l Conf., 1976 Dearnley et al. *Ion Implantation* North/Holland Publishing, Amsterdam, 1973, pp. 283–289, 387–409.

Techron Literature discloses various power amplifiers.

Thomson, "Aberrations and Tolerances in a Double-Deflection Electron-Beam Scanning System", *J. Vac. Sci. Technol.*, vol.12, No. 6, Nov./Dec. 1975, pp. 1156–1159.

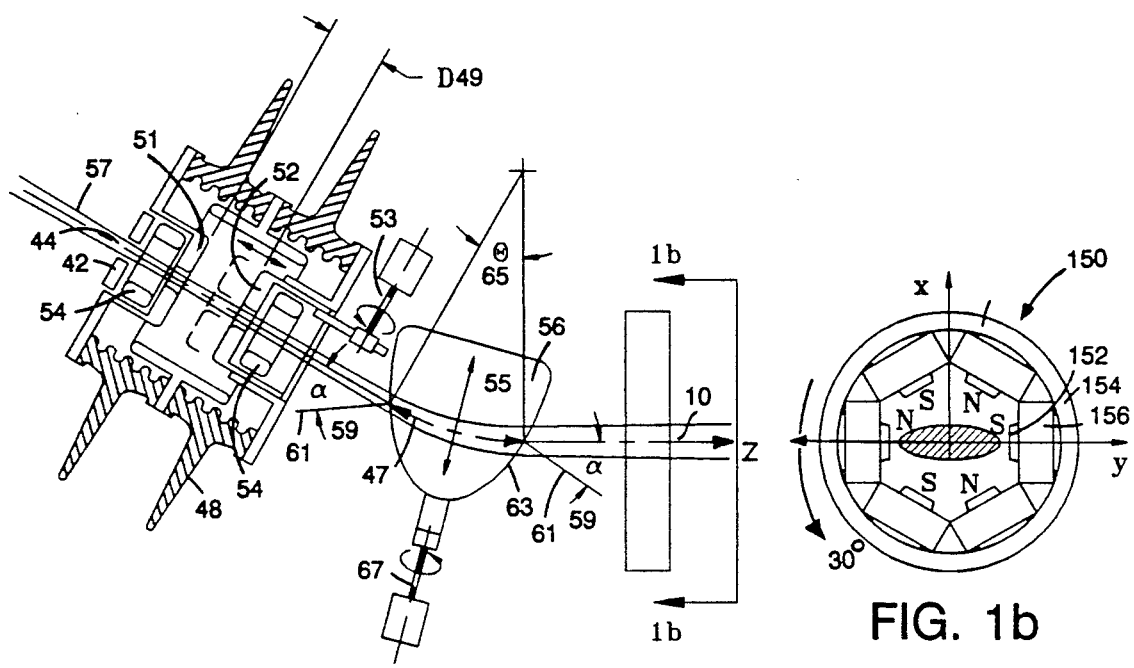
FIG. 1a
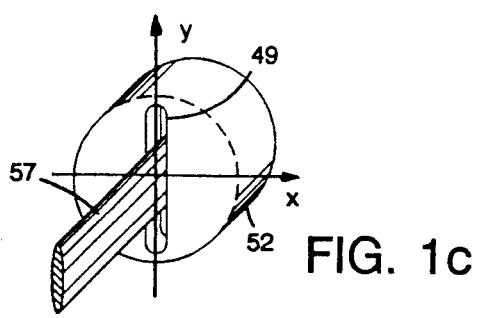
FIG. 1c
FIG. 1b

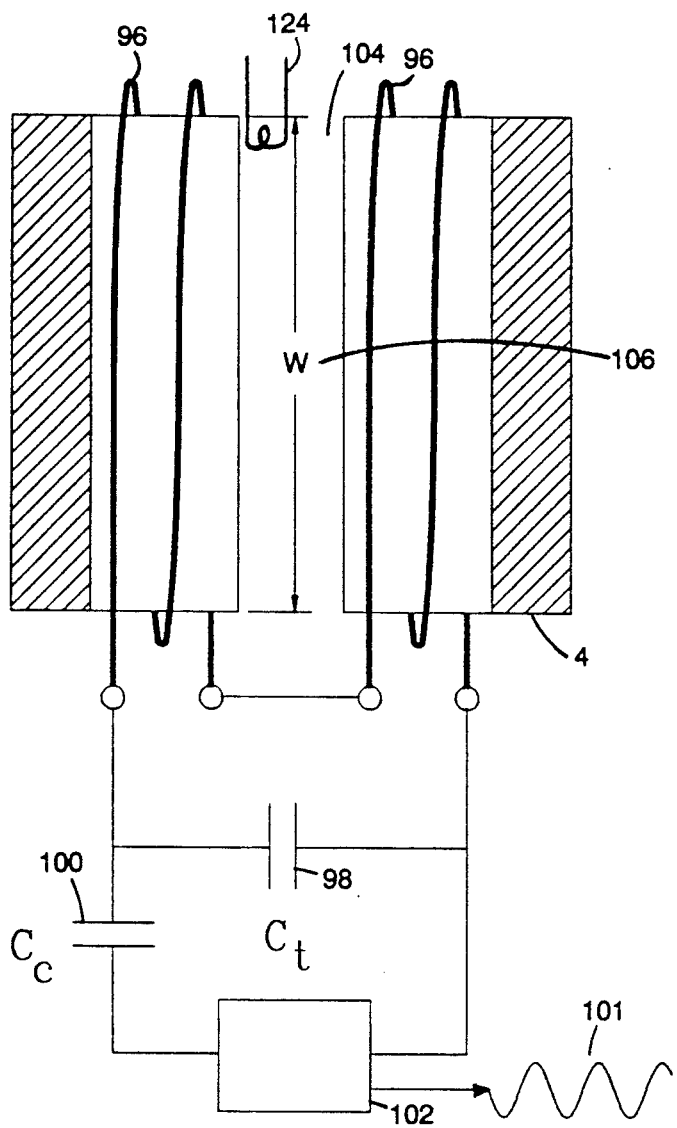
POWER AMPLIFIER   FIG. 11
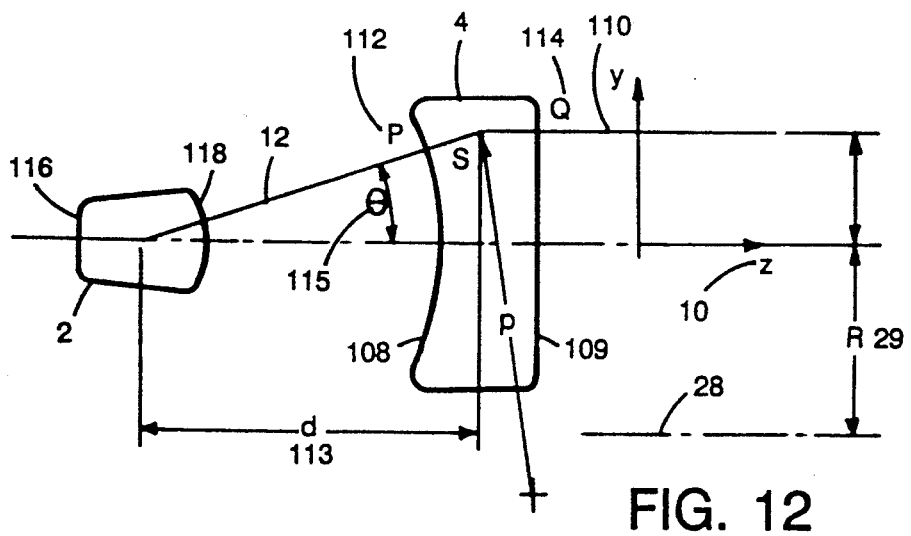
FIG. 12

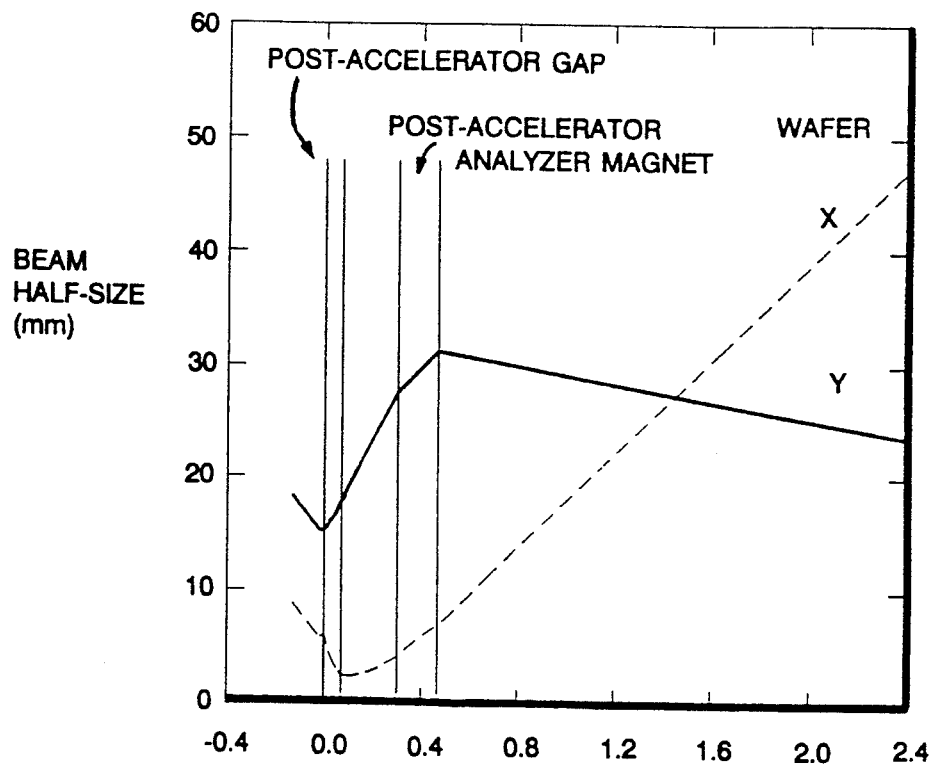
FIG. 18  POSITION FROM ACCEL ENTR. (m)
OXYGEN BEAM CURRENT=75mA
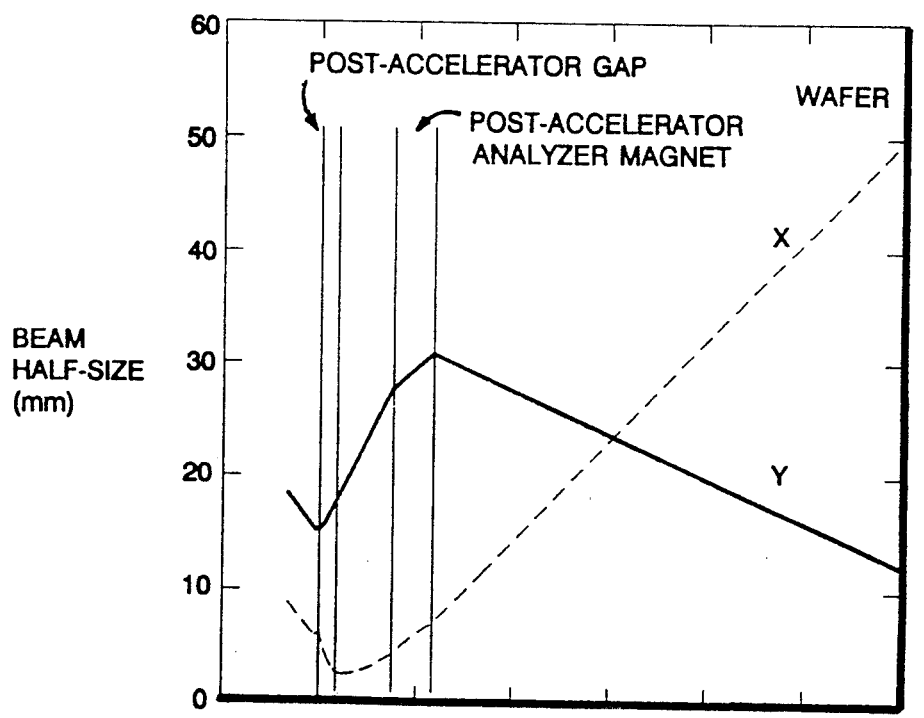
FIG. 19  POSITION FROM ACCEL ENTR. (m)
OXYGEN BEAM CURRENT=75mA

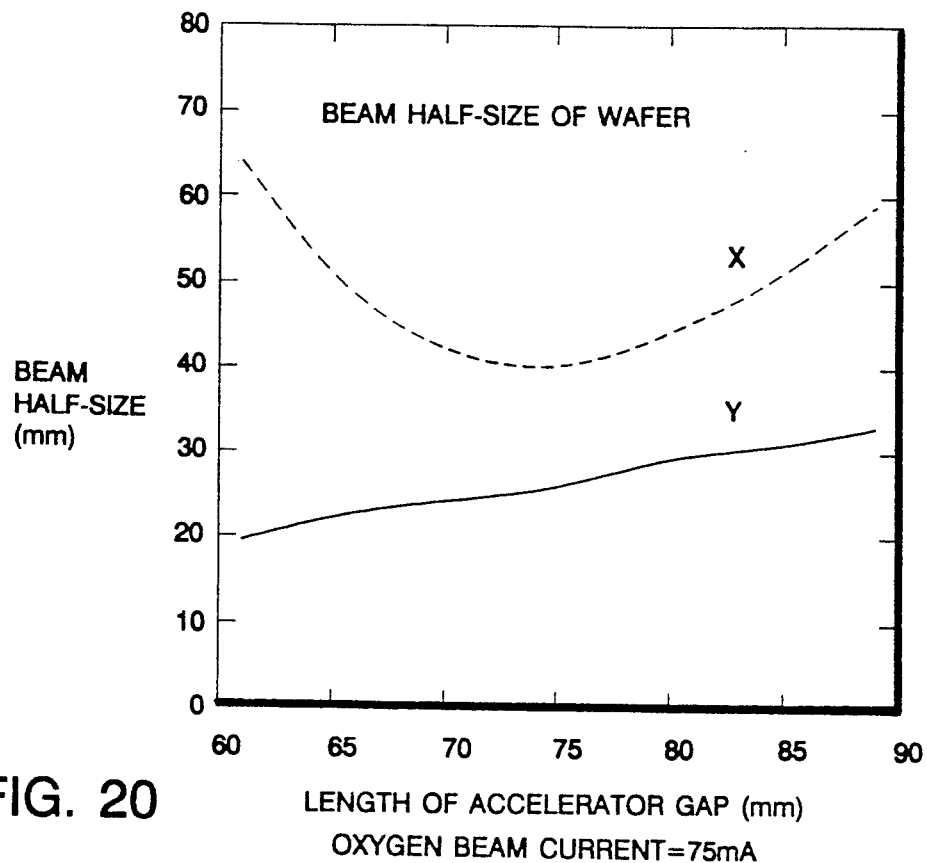
FIG. 20  LENGTH OF ACCELERATOR GAP (mm)
OXYGEN BEAM CURRENT=75mA
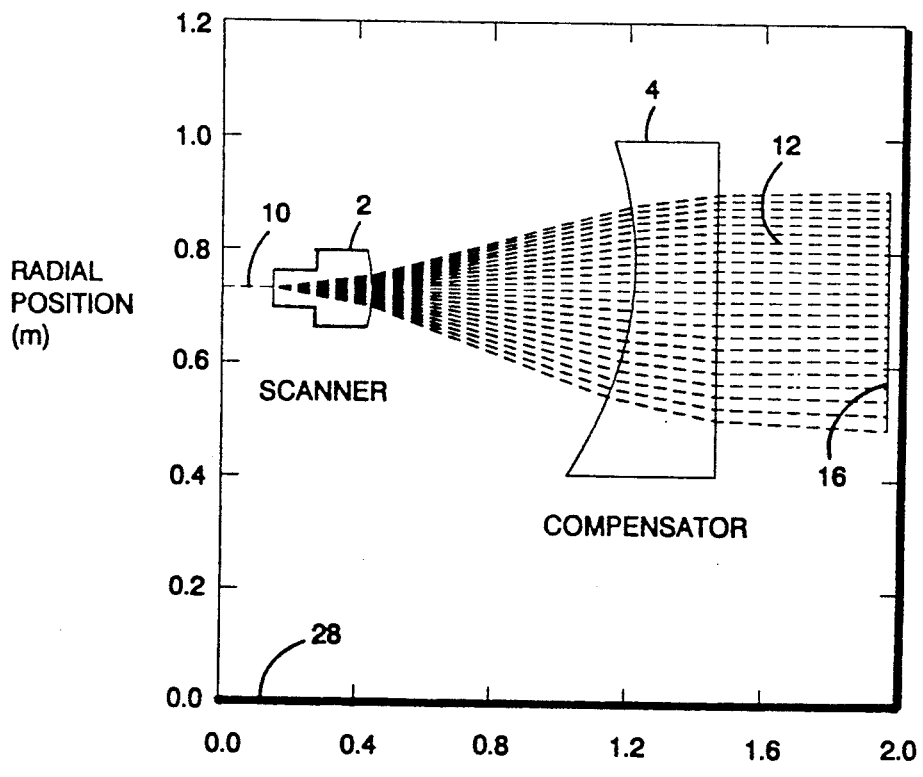
FIG. 21  DISTANCE ALONG Z-AXIS (m)
PRINCIPLE RAYS AT EQUALLY SPACED TIME INTERVALS SCANNER FIELD & SCAN VELOCITY (---) vs COMPENSATOR PHASE BEAM HALF-SIZE AT WAFER: Y (solid); X (broken)

SYSTEM AND METHOD FOR PRODUCING OSCILLATING MAGNETIC FIELDS IN WORKING GAPS USEFUL FOR IRRADIATING A SURFACE WITH ATOMIC AND MOLECULAR IONS

CROSS-REFERENCE TO RELATED APPLICATION

This application is a continuation in part of U.S. application Ser. No. 07/575,498 filed Aug. 29, 1990 now U.S. Pat. No. 5,132,544 which is incorporated herein by reference.

FIELD OF THE INVENTION

This invention relates to systems for utilizing ion beams such as in ion implanters and more generally to magnetic systems that apply strong magnetic fields to working gaps.

BACKGROUND OF THE INVENTION

Modification of semiconductors such as silicon wafers is often implemented by ion implanters, wherein a surface is uniformly irradiated by a beam of ions or molecules, of a specific species and prescribed energy. Usually, the physical size of the wafer or substrate (e.g. 8 inches or greater) is larger than the cross-section of the irradiating beam which deposits on the wafer as a spot of finite size (e.g. 1"×2"). Commonly, in high current machines, the required uniform irradiance is achieved by mechanical scanning of the wafer through the beam, either by reciprocal motion of the wafer, or a combination of reciprocal motion and rotation about an axis.

It is distinctly advantageous to have a high scanning velocity at least in one direction for a number of reasons: the irradiance uniformity is more immune to changes in the ion beam flux; a higher wafer throughput is possible at low dose levels; for high dose applications degradation from local surface charging, thermal pulsing, and local particle induced phenomena such as sputtering and radiation damage are greatly reduced.

All forms of mechanical scanning are very limited in speed and have the further disadvantage of generating particulates which degrade the surface structures on the wafer.

In a common variation, a time varying electric field is used to scan the beam back and forth in one direction, while the wafer is reciprocated in another direction or rotated about an axis. In this hybrid type of implanter the beam current and hence rate at which wafers can be processed is severely limited by the space charge forces which act in the region of the time-varying electric deflection fields. These forces cause the ions in the beam to diverge outwards, producing an unmanageably large beam envelope. Such a space charge limitation also occurs in implanters which use time-varying electric fields to scan the beam in two directions.

Space charge blow-up is the rate at which the transverse velocity of a beam increases with distance along the beam axis. This is proportional to a mass normalized beam perveance $$\xi = I M^{\frac{1}{2}} E^{-3/2} \qquad (1)$$

where I is the beam current, M is the ion mass, and E is the ion energy. (*The Physics and Technology of Ion Sources*, Ed. Ian G. Brown, John Wiley & Sons, New York 1989). For typical ion beam configurations encountered in ion beam implanters, space charge effects become limiting at a perveance of $\xi \simeq 0.02(mA)(amu)^{\frac{1}{2}}(keV)^{3/2}$. Thus, an 80 keV arsenic beam becomes space charge limited at $\simeq 1.7$ mA, while a 5 keV beam is space charge limited at just $\simeq 0.03$ mA. For the many commercial processes requiring beam currents greater than 10 mA, and in some cases very low energies as well, it is not viable to scan with time-varying electric fields.

Time-varying magnetic fields, which are used at high frequencies for scanning electron beams, have been suggested from time to time for the scanning of ion beams in implanters, since the space charge forces in general remain neutralized in a magnetic field. Unfortunately, much greater magnetic field energies are required for the deflection of the heavy ions, such as boron (B+), oxygen (O+), phosphorus (P+), and arsenic (As+), used in ion implanters. Indeed, for comparable beam energies and deflection angles, the magnetic field energy needs to be 10,000 to 100,000 times as large as that required for electrons. Consequently, the techniques developed for rapid magnetic scanning of electrons cannot be scaled to produce a structure suitable for rapid scanning of heavy ion beams. Hitherto, magnetic scanning techniques used in ion implanters have been limited to frequencies of just a few Hertz (Hz).

There are circumstances beyond ion implantation where it is also desirable to produce structures with large working gaps and large magnetic fields with components that a component of which may vary rapidly with time. The performance of such structures is limited by the difficulty associated with producing accurately defined time-varying magnetic fields.

SUMMARY OF THE INVENTION

The present invention provides both a serial hybrid type and a batch type heavy ion implanter using a magnetic scanning system capable of operating at frequencies in the regime of 20 Hz to 300 Hz. The present invention also provides, more generally, improvements in the design and performance of magnetic structures and excitation circuits, for the production of high frequency, high power oscillating magnetic fields in relatively large working gaps.

In one aspect, the present invention provides a coordinated structure that produces a combination of time-varying magnetic fields, which, by proper arrangement, enables ion beams of high current to be rapidly scanned across a substrate surface.

The invention provides the ability to construct an ion implantation machine that is operable over an extremely wide range of ions, at energies up to 400 KeV or more, with ion beam currents up to 200 mA or more.

The invention also provides improved components and subsystems useful not only for the above purposes but also for other applications. It also provides improved methods for irradiating surfaces with ions.

Important aspects of the invention provide a magnetic deflection apparatus for producing a strong oscillating magnetic field capable of deflecting a high perveance beam of atomic or molecular ions to irradiate a selected surface, the apparatus comprising a magnetic structure having pole faces defining a deflecting gap through which the ion beam passes and a magnetic circuit connecting the pole faces, an excitation coil and an associated excitation circuit adapted to apply to the coil an excitation current having a fundamental frequency of the order of 20 Hz or greater together with substantially higher order harmonics, the fundamental frequency and wave form of the current selected to produce a magnetic field in the magnetic structure having the fundamental frequency and higher order harmonic components to establish the frequency of oscillation and the velocity profile of the deflection of the beam, the magnetic circuit comprised, at least in part, of a plurality of laminations of high magnetic permeability material each of which has a thickness in the range between about 0.2 and 1 millimeter, the laminations being separated by relatively thin electrically insulating layers, and the laminations providing a low reluctance magnetically permeable path for the fundamental frequency and higher order harmonic components of the strong magnetic field, the laminations serving to confine induced eddy currents to limited values in local paths in respective laminations, thereby enabling the desired deflection of the high perveance beam.

In one important case, the deflection apparatus is featured as a primary scanner. In another important case, the deflection apparatus is capable of reorienting a previously periodically deflected high perveance beam of atomic or molecular ions to irradiate a selected surface, in which case the wave form preferably is sinusoidal although in other cases it too may have higher order harmonies.

A more general aspect of the invention concerns a magnetic apparatus for producing a desired strong magnetic field in a working gap, a magnetic structure having pole faces defining the working gap in which the magnetic field is desired and a magnetic circuit connecting the pole faces, with an excitation coil and, an associated excitation circuit.

According to this more general feature and applicable in preferred embodiments of the aforementioned scanning and compensating apparatus as well, at least a part of the magnetic circuit is comprised of different sets of the laminations disposed cross-wise to each other in the manner that magnetic flux passing through any given lamination in one of the stacks is distributed into a multiplicity of laminations in the other of the stacks in completing its path in the magnetic circuit.

In the form of a scanner for a beam of charged particles, perferably the excitation circuit is adapted to apply to the excitation coil a substantially triangular wave form, represented by the fundamental frequency and higher order harmonics.

Preferred embodiments of these various aspects of the invention have one or more of the following features.

A pole piece defining the pole face is comprised of at least some of the laminations with edges of the laminations forming the respective pole face; preferably the edges of the laminations being shaped to provide a pole face of predetermined form for influencing the effect of the field.

The pole pieces defining the pole faces are made of ferrite material; preferably the pole faces being shaped to provide a pole face of predetermined form for influencing the effect of the field.

The gap of the magnetic device is small, constructed to receive a ribbon-profile ion beam with the long dimension of the profile extending parallel to the pole face, the magnetic structure arranged to deflect the beam in the long direction of the ribbon-profile.

The magnetic circuit is comprised of a single stack of the laminations which integrally forms a yoke and pole pieces.

A dynamic feedback control is provided comprising a magnetic field detection means for detecting the magnetic field of the magnetic device and producing signals representing the magnetic field generated by the excitation coil, and a feedback control system for controlling the excitation current producing the magnetic field in a closed loop arrangement with the magnetic excitation circuit and the magnetic field detection means, preferably the field detection means comprising at least one inductive coil inside of the magnetic circuit.

The magnetic circuit comprises first and second pole pieces and a yoke connecting the pole pieces, the yoke comprising a continuous lamination strip wound in the form of a coil to effectively form a stack of laminations. In certain preferred embodiments the pole pieces are each formed by a respective stack of the laminations and edges of the laminations of each of the pole pieces are disposed against a side of the laminated yoke coil so that each lamination of each the pole piece crosses a multiplicity of the lamination layers of the coil to distribute its magnetic flux among them, and preferably also each of the pole pieces comprises at least two sections with one section disposed on each side of a single laminated yoke coil, and preferably the lateral width of the pole pieces increases from the first to the second section of each pole piece to accommodate a progressively deflected beam.

In another preferred case, the pole pieces are each formed by a respective block of ferrite material disposed against a side of the laminated yoke coil so that each the pole pieces crosses a multiplicity of the lamination layers of the coil to distribute its magnetic flux among them, and in certain preferred embodiments each of the pole pieces comprises at least two sections with one section disposed on each side of a single laminated yoke coil, and preferably the lateral width of the pole pieces increases from the first to the second section of each pole piece to accommodate a progressively deflected beam.

At least one cooling plate is provided to remove heat generated by the induced eddy currents, the cooling plate being attached to a side of the stack of lamination in thermal contact with a substantial number of the lamination layers.

The magnetic device comprises two laminated yoke coils, and pole pieces disposed between the laminated yoke coils. In certain preferred cases the pole pieces are comprised of stacks of laminations, oppositely directed edges of the laminations of each of the pole pieces being disposed respectively against sides of the laminated yoke coils so that each lamination of each pole piece crosses a multiplicity of the lamination layers of both coils to distribute its flux among them and in other preferred cases, the pole pieces are comprised of blocks of ferrite material, the pole pieces being disposed respectively against sides of the laminated yoke coils so that each pole piece crosses a multiplicity of the lamination layers of the laminated yoke coils to distribute its flux among them.

In the form of a compensator structure for use with a magnetic scanner for an ion beam, in certain preferred cases, wherein the magnetic circuit comprises first and second pole pieces and a yoke connecting the pole pieces, the pole pieces being each formed by a respective stack of the laminations, first edges of which form the gap of the magnetic structure, the yoke comprising at least one continuous lamination strip wound in the form of a coil to effectively form a stack of laminations, second edges of the laminations of each of the pole pieces being disposed against a side of the laminated yoke coil so that each lamination of each pole piece crosses a multiplicity of the lamination layers of the coil to distribute its flux among them, the gap between the pole pieces being sized to receive the beam, the width of the pole pieces being adjusted to accommodate the beam previously deflected by the scanner, and the length of the pole pieces designed to reorient the deflected beam to a desired condition. Preferably, the length of the pole pieces is constructed to reorient the beam to assume a desired angular direction relative to an axis of the compensator over the deflection range of the beam received by the compensator, and preferably the magnetic structure is constructed such that the length of the ion beam path exposed to the force field of the magnetic structure varies with the deflection angle of the beam to make the beam parallel with an intended output axis.

In important preferred cases the excitation coil for the magnetic compensating structure is driven by a resonating compensator excitation circuit; preferably the excitation circuit comprising excitation coils connected in series, a tank capacitance connected in parallel with the excitation coils, a coupling capacitance having a value related to the inductance of the circuit to achieve resonant operation, and a power amplifier driven by the fundamental frequency signal for delivering power to the circuit to compensate for the energy losses in the excitation circuit and the magnetic structure.

In preferred embodiments of the compensator, constructed for use with a scanner driven at a fundamental frequency by a scanning excitation circuit, the resonating compensator excitation circuit is constructed to operate in resonance with the fundamental frequency of the scanning excitation circuit in phase locked relationship therewith at a predetermined phase angle difference. Preferably, the magnetic compensating structure comprises pole pieces having surfaces on the beam entry and exit sides of cooperatively selected shape to increase, dependently with deflection angle of the beam, the length of the ion beam path exposed to the force-field of the magnetic compensating structure to compensate for the contribution to the deflection angle caused by higher order harmonics of the scanning excitation circuit.

In certain embodiments a portion of the magnetic circuit is formed by separate stacks of flat laminations disposed cross-wise to one another in the flux-distributing relationship.

Another important aspect of the invention features a magnetic scanning system for rapidly sweeping a high perveance beam of atomic or molecular ions over a selected surface, the beam initially propagati.g in a predetermined direction, the scanning system comprising a magnetic scanning structure and an associated scanning excitation circuit for repeatedly sweeping the ion beam in one dimension in response to an oscillating magnetic field having a fundamental frequency and higher order harmonics induced by excitation current from the circuit, and a separate magnetic compensating structure and associated compensating excitation circuit spaced from the scanning structure along the beam axis, for continuously deflecting the ion beam after it has been swept by the scanning structure, to re-orient the beam to a direction substantially parallel to an output axis of the system, the scanning circuit and the compensating circuit having separate power sources having wave forms at the same fundamental frequency for their respective scanning and compensating functions, the circuits being in constant phase relationship with a predetermined phase angle difference.

Preferred embodiments of this aspect of the invention have one or more of the following features.

Means are provided to produce different, complementary wave forms for the scanning and compensating circuits.

The ratio of the lateral width of the gap at the entrance of the magnetic scanning structure to the gap spacing is of the order of 3 to 1.

The lateral width of pole pieces of the scanning structure and the compensating structure increase along the length of the beam axis to accommodate a progressively wider beam sweep.

The magnetic scanning structure and the magnetic compensating structure each comprises a plurality of laminations of high magnetic permeability material having thickness in the range between about 0.2 and 1 millimeter, the laminations being separated by relatively thin electrically insulating layers, the laminations forming a yoke connecting pole pieces that define a gap through which the ion beam passes, the laminations providing a low reluctance magnetically permeable path for the fundamental frequency and higher order harmonic components of the magnetic field, the laminations serving to confine induced eddy currents to limited values in local paths in respective laminations.

Means are arranged to provide the high perveance ion beam with a ribbon-profile entering the scanning structure, the scanning structure arranged to deflect the ion beam in the long direction of the ribbon profile.

The compensating excitation circuit is constructed to operate in resonance with the fundamental frequency of oscillation of the previously deflected beam, preferably a synthesizer producing the fundamental frequency and preferably the excitation circuit comprises excitation coils connected in series, a tank capacitance connected in parallel with the excitation coils, a coupling capacitance having a value related to the inductance of the circuit to achieve resonant operation, and a power amplifier driven by the fundamental frequency signal for delivering power to the circuit to compensate for the energy losses in the excitation circuit and the magnetic structure.

The magnetic scanning system further comprises means to drive the magnetic scanning structure by an excitation current of a generally triangular wave formed by the fundamental frequency and superimposed higher order harmonics, and means to drive the magnetic compensating structure by excitation current in resonance with the fundamental frequency, preferably the generally triangular wave form being selected to compensate for a component of scanning motion of the surface being irradiated.

The system includes a dynamic feedback control comprising magnetic field detection means for detecting the rate of change of a magnetic field with time of the magnetic scanning system and producing signals representing the magnetic field and, a feedback control system for controlling the excitation current producing a prescribed magnetic field in a closed loop arrangement with the respective magnetic excitation circuit and magnetic field detection means, preferably the field detection means comprise at least one inductive coil inside of the magnetic circuit and preferably the feedback control system further comprises a signal conditioner connected to the inductive coil and adapted to eliminate circuitry-induced distortions of the detected signal by adjusting the gain and shape of the detected signal, a phase compensator adapted to receive the signal from the signal conditioner and to correct the detected signal for a phase shift arising from electronic delay times and finite permeability of the yoke material, a differential amplifier adapted to generate and to amplify an error voltage which is a difference between a reference signal and the detected signal conditioned and compensated by the conditioner and the compensator, respectively, and the power amplifier of the resonant excitation circuit adapted to receive the error voltage and generate excitation current to the excitation coil proportional to the error voltage to produce the prescribed magnetic field.

Preferably, the system includes a respective the dynamic feedback control for both the magnetic scanning structure and for the magnetic compensating structure.

The surfaces on the beam entry and beam exit sides of the magnetic scanning structure and of the magnetic compensating structure are shaped in a predetermined cooperative relationship relative to the profile of the beam entering the system to establish cooperating magnetic fringing fields for both magnetic structures that cooperate to produce a desired profile of the beam and desired limitation on the angular deviation of ions within the beam irrespective of the scanned position of the beam.

Prior to the magnetic scanning structure, an electrostatic-magnetostatic system for accelerating and focusing a high perveance beam of atomic or molecular ions comprising a set of acceleration electrodes forming an electrostatic accelerating system charged by a power source, the electrodes adapted to electrostaticly focus the ion beam in one dimension, the electrodes adapted to supply electrostatic energy to accelerate the ion beam in the direction corresponding to the potential difference across the electrodes, a suppressor electrode for maintaining electrons within the beam, the electrode having an aperture and being located at the exit port of the electrostatic accelerating system, and a post-acceleration analyzer magnet arranged to focus the beam in the other dimension, the magnet having means for adjusting the angles of incidence and exit of the ion beam into the entrance region of the post-acceleration magnet.

Preferred embodiments of this accelerating and focusing system have one or more of the following features.

The electrodes form a slotted aperture, the electrodes adapted to focus the beam in the direction of the short dimension of the slotted aperture.

Means are arranged to provide the high perveance ion beam of a ribbon-profile entering the accelerating system, the accelerating system arranged to focus the beam in the short direction of the ribbon profile.

The set of acceleration electrodes comprises two relatively movable electrodes for electrostatic focusing of the ion beam and/or the set of acceleration electrodes comprises three fixed electrodes adapted to electrostaticly focus the ion beam by varying the electric potential on the center electrode. The means for adjusting the angles of incidence and exit of the ion beam into the entrance and exit regions of the post-acceleration magnet comprises means for laterally moving the post-acceleration magnet relative to the beam path, thereby focusing the beam while removing neutral particles and ions of unwanted momentum ions from the ion beams. A multipole magnet with a static magnetic field is arranged to eliminate aberration of the ion beam created by the post-acceleration analyzer magnet, preferably the multipole magnet being a sextupole.

The accelerating and focusing feature of the invention has importance in its own right. Thus, another aspect of the invention is an electrostatic system for accelerating and focusing a previously produced high perveance beam of atomic or molecular ions comprising a set of acceleration electrodes of the electrostatic accelerating system having a slotted aperture, the electrodes adapted to supply electrostatic energy to accelerate the ion beam in the direction corresponding to the potential difference across the electrodes, and a suppressor electrode for maintaining electrons within the beam, the electrode having a slotted aperture and being located at the exit port of the electrostatic accelerating system.

Another aspect of the invention is the provision in a system for delivering a substantially uniform dose of ions of a high perveance atomic or molecular beam to a selected surface, means for producing a high perveance beam, an electrostatic system for accelerating and focusing the beam having a set of acceleration electrodes with slotted apertures, the electrodes adapted to focus the beam in the direction of the short dimension of the slot, a focusing device positioned along the beam axis, for focusing the beam in the dimension of the beam not being focused by the slotted apertures, and a scanning system for rapidly sweeping the ion beam in order to achieve uniform irradiation of the selected surface by the beam.

The various specific features of preferred embodiments that have been mentioned above, of course, apply to these aspects as well.

Certain preferred embodiments of the magnetic scanning system that have been described employ a reciprocating carrier for repeatedly carrying the selected surface mounted on the carrier under the beam to effect scanning in one dimension, the magnetic scanning system arranged to rapidly sweep the ion beam in the orthogonal dimension. Other preferred embodiments feature a driven rotatable carrier for repeatedly carrying the selected surface mounted on the carrier under the beam to effect scanning in one dimension, the magnetic scanning system arranged to rapidly sweep the ion beam in the radial direction of the rotatable carrier in order to to effect scanning in the other dimension, and means for producing the excitation wave form applied to the magnetic scanning system to govern its sweeping action, the functional dependence of the excitation wave form relating changes in the scan velocity in inve se dependence with change in the radial distance between the instantaneous location of the center of the beam and the axis of rotation of the rotatable carrier.

In either case the system preferably includes a focusing device for determining the dimension of the beam in the direction of magnetic scanning and normal thereto, preferably, the focusing device comprising an adjustable accelerator having slotted apertures, the narrow dimension of the apertures corresponding to the direction normal to the magnetic scanning dimension.

In either of the examples of a mechanical scan in the second direction, the magnetic compensating structure has its beam entry and exit sides cooperatively shaped to cause the length of the ion beam path exposed to the force field of the magnetic compensating structure to vary with deflection angle in a cooperative relationship with the field produced in the compensator structure to achieve uniform irradiation of the selected surface carried by the mechanical scanning arrangement.

Another aspect of the invention is a system for delivering a substantially uniform dose of ions of a high perveance atomic or molecular beam to a selected surface comprising a driven rotatable carrier for repeatedly carrying the selected surface mounted on the carrier under the beam to effect scanning in one dimension, the magnetic scanning system arranged for rapidly sweeping the ion beam in the radial direction of the rotatable carrier to effect scanning in the other dimension, and means for producing an excitation wave form applied to the magnetic scanning system to govern its sweeping action, the functional dependence of the wave form relating changes in the scan velocity in inverse dependence with change in the radial distance between the instantaneous location of the center of the beam and the axis of rotation of the rotatable carrier.

In preferred embodiments of this aspect, the functional dependence of the excitation wave form is determined according to the formula for the scan velocity $\dot{Y}$:

$$\dot{Y} = \frac{k}{Y + R}$$

where k is a constant dependent on the scan range and periodicity T of the wave form and R is the distance between the axis and the center of the beam.

The invention also features, as another aspect, a method of rapidly sweeping over a selected surface a high perveance beam of atomic or molecular ions initially propagating in a predetermined direction, comprising the steps of: (a) introducing the ion beam to a magnetic scanning structure, (b) sweeping the ion beam in one dimension by an oscillating magnetic field having a fundamental frequency of at least 20 Hz and higher order harmonics induced by a scanning excitation current generated by a scanning excitation circuit, to produce a constantly changing deflection angle, and (c) continuously re-deflecting the deflected ion beam using a separate magnetic compensating structure to re-orient the ion beam to a direction substantially parallel to an exit axis of the compensator by driving the magnetic compensating structure with a compensating excitation current having the same fundamental frequency as the scanning excitation current, the compensating excitation current being generated by a separate compensating circuit operating in a phase-locked mode with the scanning excitation circuit.

In preferred embodiments of this method, the compensating excitation current is generated in resonance with the fundamental frequency of the scanning excitation current, and preferably the length of the ion beam path exposed to the force-field of the magnetic compensating structure is varied to compensate for the contribution to the deflection angle caused by higher order harmonics of the scanning excitation current.

Another aspect of the invention is a method of implanting a uniform dose of oxygen ions into a silicon wafer to form a buried oxide layer, using an ion implantation system, comprising the steps of: (a) accelerating a high perveance oxygen ion beam of above 50 mA current to energy above 100 keV, (b) rotating the silicon wafer mounted on a carrier at above 50 rpm, (c) with a magnetic scanning system, scanning the ion beam in the radial direction of the carrier at a frequency above 50 Hz while maintaining a substantially constant incident angle of the beam to the surface of the silicon wafer, and (d) controlling the system to obtain substantially uniform dose across the wafer under substantially uniform temperature conditions.

Preferred embodiments of this aspect of the invention have one or more of the following features.

The ion beam energy is about 200 keV. The scanning step includes deflecting the beam in an oscillating pattern using a magnetic scanner drive by a substantially triangular wave form and thereafter applying compensating magnetic fields to reorient the deflected beam to a desired direction, preferably, the compensating step is performed with a dynamic magnetic deflecting compensator system driven at the same frequency in phase locked relationship with the scanning, preferably, this compensator being driven in resonance with the scanning.

The step of controlling the system includes varying the scan velocity of the scanned beam to obtain the uniform implantation dose of oxygen ions by maintaining inverse functional dependence of the scan velocity to the radial distance between the instantaneous location of the center of the beam and the axis of rotation of the rotatable carrier.

BRIEF DESCRIPTION OF DRAWINGS

FIG. 1a is a view of an electrostatic part of FIG. 1 on a magnified scale showing details of a particular preferred embodiment;

FIG. 1b is a view taken on line 1b—1b of FIG. 1a, and shows the pole arrangement of the sextupole of the embodiment of FIG. 1;

FIG. 1c is a view of the slot-shaped electrodes of post-accelerator shown in FIGS. 1a and 1d.

FIG. 11 is a schematic diagram of a resonant excitation circuit for the preferred compensator of FIG. 1;

FIG. 12 illustrates in schematic form examples of contours of the entry and exit faces of the magnetic structures of the scanner and compensator of FIG. 1;

FIG. 18 shows the variation of beam sizes from the post-accelerator to the wafer in the SIMOX application of the preferred embodiment.

FIG. 19 shows how the y-beam size becomes smaller than in FIG. 18 when the post-accelerator magnet is laterally moved to produce more y-focusing as shown in FIG. 1b.

FIG. 20 shows the variation in beam size at the wafer for various spacings between the electrodes of the post-accelerator in the SIMOX application of the preferred embodiment.

FIG. 21 shows the principal rays of the deflected beam at equally spaced time intervals over one half an oscillatory period for the SIMOX application of the preferred embodiment.

DESCRIPTION OF THE PREFERRED EMBODIMENT

Figure 1:
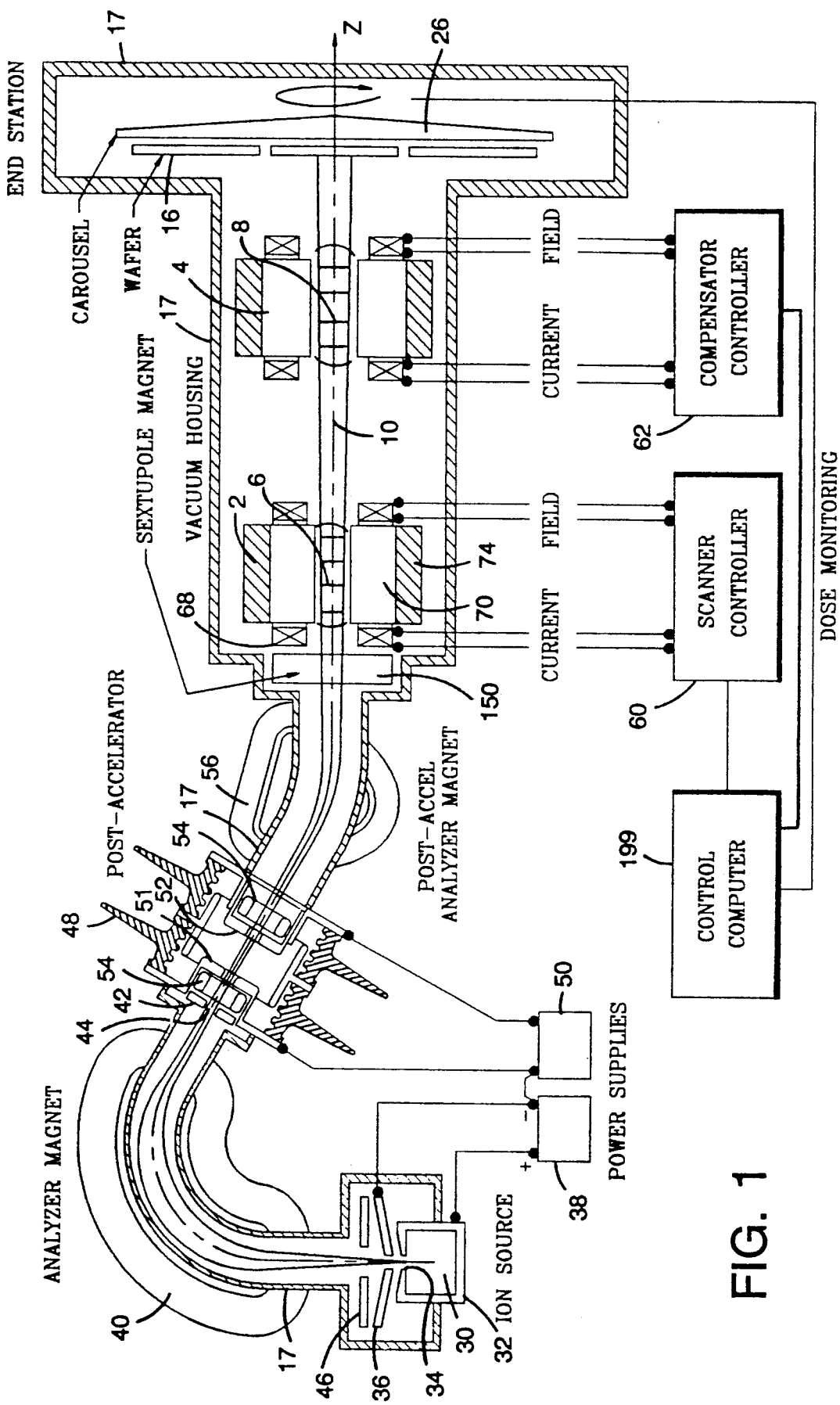
FIG. 1 is a diagrammatic general representation of a preferred ion beam magnetic scanning system according to the invention.
Figure 2:
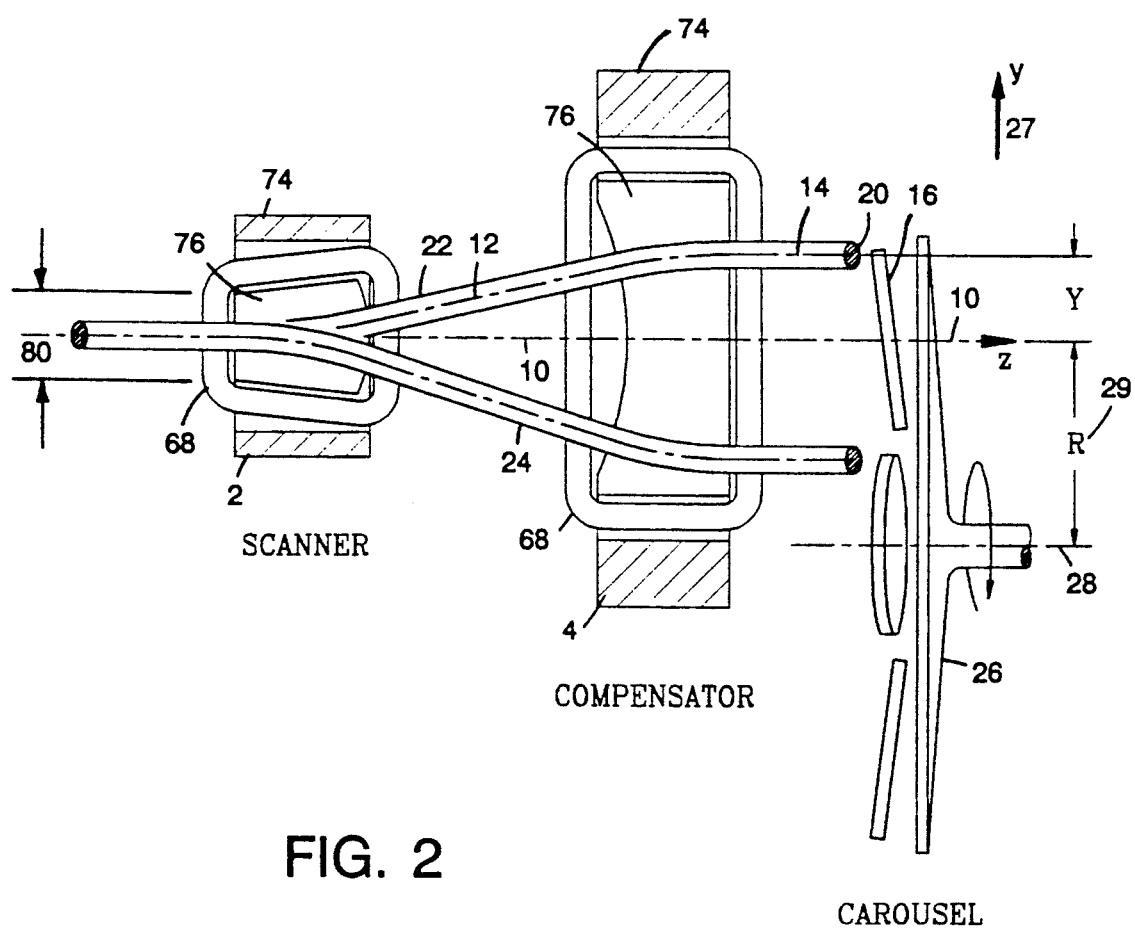
FIG. 2 is a schematic diagram of the beam envelope traced by ions deflected by a scanner and a compensator of the system of FIG. 1 at two different instants of time.

With reference to FIGS. 1 and 2 there is shown a diagrammatic representation of the elements of a preferred embodiment of the ion beam magnetic scanning system according to the invention, using two time-oscillatory magnetic deflections of ions produced respectively in a scanner 2 followed by a compensator 4. The two oscillatory magnetic fields 6,8 are caused to have the same periodicity corresponding to a frequency of typically 150 Hz. Ions travelling along paths more or less parallel to the z-axis 10 are caused to undergo oscillatory deflections in the yz-plane by the scanner 2; the y direction being perpendicular to the plane of FIG. 1. At an instant in time, ions that have just emerged from the scanner 2 remain in the form of a beam but now the longitudinal direction 12 of the beam is oriented at an angle to the z-axis 10 as a result of the y magnetic deflection produced in the scanner 2. A short time thereafter, the ions reach the compensator 4 at a y position considerably displaced from the z-axis. The compensator 4 deflects the ions again in the yz-plane but in a direction opposite to the first deflection produced in the scanner. In one important feature of this preferred embodiment, the respective oscillatory fields 6,8 of the scanner and compensator are coordinated such that upon emerging from the compensator 4 the ions, still in the form of a beam 14, are once again travelling in a direction parallel to the z-axis 10. However, the position of the ion beam at the target 16 is rapidly varying with time along the y direction, oscillating back and forth at the repetition frequency of the oscillatory fields, scanning over a distance related primarily to the amplitude of the oscillatory field 6 in the scanner and to a lesser extent on the amplitude of the oscillatory field 8 in the compensator; and the beam direction is parallel to the z-axis 10 and the angular deviation or spread in the beam, and the size 20 of the cross-section of the beam reaching the target (beam spot size) is nearly constant irrespective of y position. This parallel scanning technique is shown in FIG. 2 by the beam envelope 22 traced out by ions entering the scanning system at one instant of time, and the envelope 24 that occurs at another instant of time.

Figure 3:
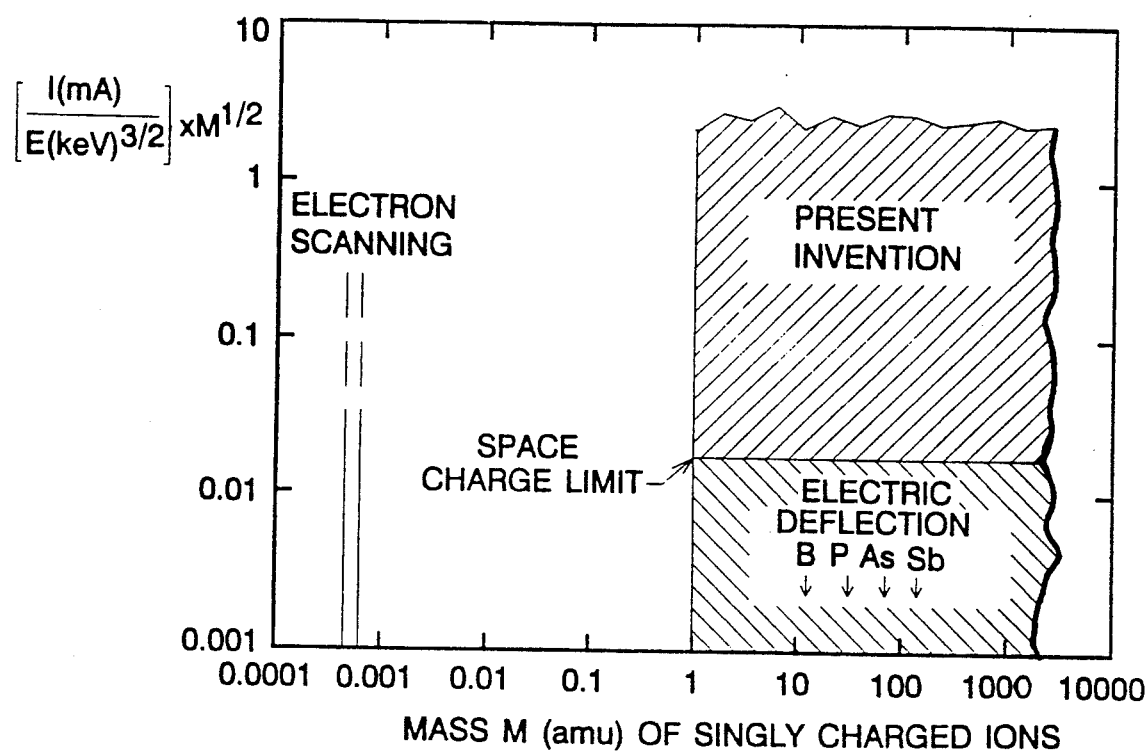
FIG. 3 is a graph indicating the range of perveance of beams for which the system of the invention is uniquely applicable.

FIG. 3 illustrates the great utility of the present invention to rapidly scan high perveance beams as defined by Eq. (1). An important feature of the preferred embodiment is that the scanner and compensator fields 6,8 are only magnetic in nature. In the absence of electric fields, residual electrons are held within the beam, neutralizing the repulsive ion space charge forces. The parallel scanning technique thus described remains effective without limit as the ion beam current is increased.

One example of the usefulness of the present invention is the need in SIMOX processes to heavily irradiate the surfaces of silicon wafers with oxygen ions at energies in the region of 200 keV for the purpose of forming a buried silicon dioxide insulating layer in the silicon wafer. The silicon wafer can be as large as 12 inches in diameter. A batch of wafers 16 is mounted on a carousel 26 rotating about an axis 28, displaced but usually parallel to the z-axis, as shown in FIGS. 1 and 2. The oxygen ion beam, typically of 50 to 100 mA current, is rapidly scanned in the y-direction 27, i.e. in a radial direction of the rotating carousel, across the surface of the wafers 16, without degrading the implant quality as a result of thermal pulsing and ion damage that would occur if the beam dwelled on one region of the surface for too long a time, and with a scan velocity that varies with time to compensate for variation in radial distance of the beam relative to the spinning carousel, such as to uniformly irradiate the wafer surface 16.

FIGS. 1 and 2 further show details of the preferred embodiment ion implanter in which positively charged ions of more or less selected species such as boron, oxygen, phosphorus, arsenic or antimony, are generated in the plasma chamber 30 of a source 32 and emerge from an orifice 34 (or array of orifices) usually of circular or preferably of slot shape. The ions are extracted by an extraction electrode 36, which is held at an electrical potential typically 5 to 80 kV more negative than that of the plasma chamber by a power supply 38. The geometrical shape and position of the extraction electrode 36 in relation to the plasma chamber orifice 34 is chosen such that a well-defined beam emerges from the extraction electrode 36 in which the angular spread of the ion trajectories is typically less than 2°. The ion beam is purified according to the ion momentum to charge ratio (Mv/Q, v=ion velocity), by an analyzer magnet 40 and cooled plates 42 defining a finite width slit-like aperture 44. This preferred embodiment produces a ribbon-shaped beam having its narrow dimension lying in the direction of the oscillatory fields 6 in the gap of scanner 2, thus enabling the aforesaid gap to be minimized which in turn minimizes the oscillatory field energy and causing the beam to be scanned in the y direction, parallel to the long dimension of the beam at scanner 2. A ribbon-shaped beam is most easily generated by the analyzer magnet 40 if the beam emerging from the ion source 32 is itself ribbon-shaped. Both the Freeman and the ECR types of ion source, described in *The Physics and Technology of Ion Sources*, Ed. Ian G. Brown, John Wiley & Sons, New York 1989, frequently used in ion implanters, produce ribbon-shaped beams by having a long slot-shape in the plasma chamber orifice 34 and the extraction aperture 36.

A suppressor electrode 46 held at a more negative potential than the extraction electrode 36 inhibits back streaming electrons from reaching and damaging the ion source plasma chamber 30. This suppressor electrode also prevents electrons from being drained out of the ion beam as the ion beam passes to the analyzer magnet 40. Such electrons neutralize the ion charge and prevent space charge blow-up of the beam in the drift region between the source 32 and analyzer magnet 40.

In some important applications, such as oxygen implantation, a second stage of acceleration is needed to reach the required final ion energy. This is shown as a post-accelerator 48 in FIG. 1, comprising two or more electrodes held at different electrode potentials by a power supply 50. Positive ions in the beam are accelerated when the last electrode 52 is at a more negative potential than the first electrode 51. (Deceleration can also be implemented by setting the last electrode 52 at a more positive potential than the first electrode 51. In some cases this is useful to achieve high beam currents at low energy.) Suppressor electrodes 54 are fitted at each end of the post-accelerator 48 to prevent unnecessary electron loading on the power supply 50, and to prevent draining of electrons from the beam on either side of the post-accelerator which would leave the beam unneutralized and subject to repelling space charge forces. The first suppressor electrode is needed only if the beam is to be decelerated. Ions emerge from the post-accelerator with an energy determined by the settings on each of the power supplies 38 and 50. In situations where post-acceleration is used, the post-accelerator 48 is usually located after the analyzer magnet 40. This enables the analyzer to operate at a lower magnetic energy. Moreover, unwanted ion species from the source 32 are prevented from entering the post-accelerator 48 by the resolving aperture 44, thereby minimizing the electric current and power capability needed for the post-accelerator power supply 50. It is advantageous to use a second analyzer magnet 56 positioned after the post-accelerator 48 to remove neutral particles and ions possessing an unwanted momentum, generated as a result of charge exchange processes occurring between the beam and the residual background gas in the region from the resolving aperture 44 to the exit end of the post-accelerator 48.

FIG. 1a illustrates an important feature of the preferred embodiment wherein the size and angular deviation of the beam at the target 16 is controlled primarily in the x-direction by adjusting the spacing 45 between the first 51 and second 52 electrodes of the post-accelerator 48, and primarily in the y-direction by adjusting the transverse position 55 of the post-accelerator analyzer magnet 56. The x-direction is defined as the transverse direction orthogonal to both the y-direction and the instantaneous principal axis of the beam. The analyzer magnet 40 is coordinated with the location of the source 32 such that the beam 57 entering the post-accelerator 48 is ribbon-shaped with the smaller dimension in the x-direction as previously described, and also converging in the x-direction. The apertures 49 in the first 51 and second 52 electrodes of the post-accelerator 48 are slot-shaped with the long dimension in the y-direction as shown in FIG. 1c. The strong electric field gradients in the x-direction produced by these apertures generate an overall convergent focusing action on the beam in the x-direction, compensating for the diverging action of the space charge forces also acting on the beam in the x-direction as a consequence of neutralizing electrons being driven out of the beam by the non-zero electric field present in the post-accelerator 48. The x-focusing action increases as the distance between the first 51 and second 52 electrodes decreases, which in practice is varied remotely via a motor drive 53 to suit a given beam perveance according to Eq. 1.

Figure 1D:
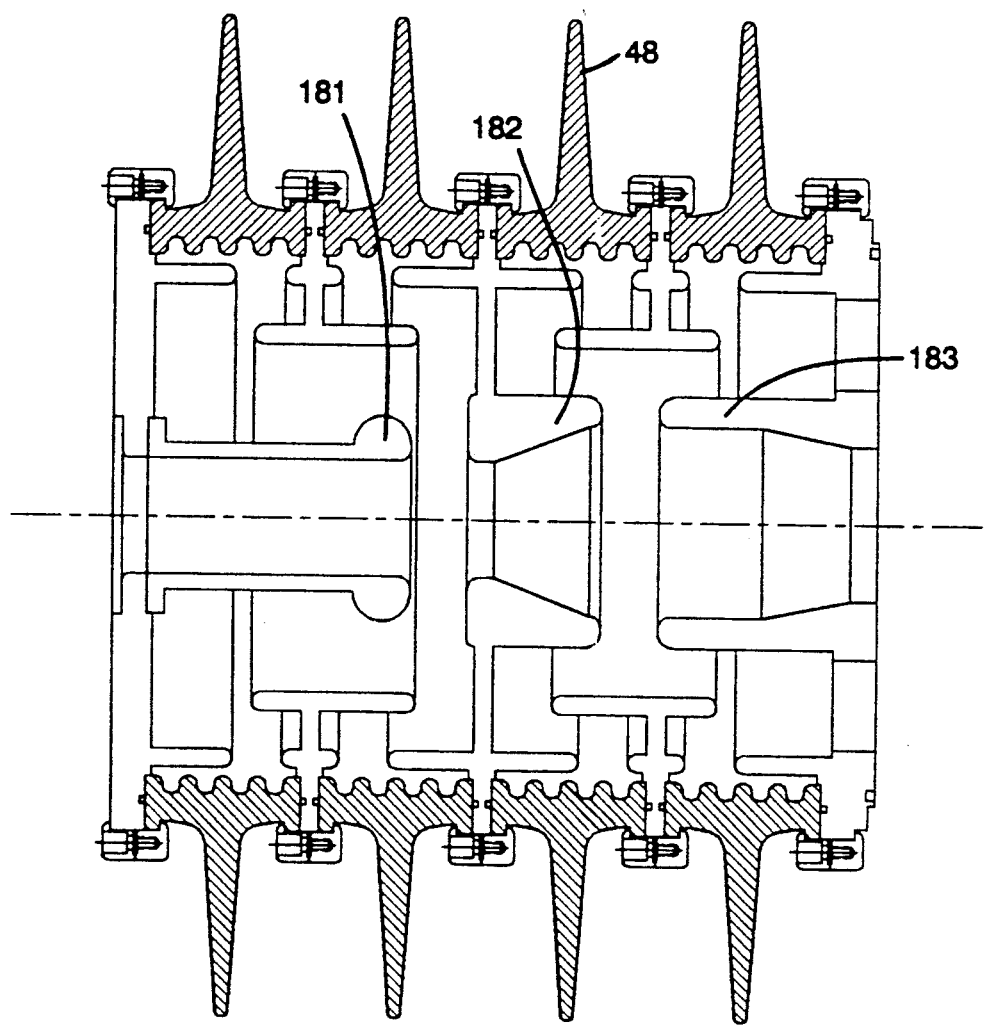
FIG. 1d shows a three electrode accelerator gap as an alternative embodiment.

In yet another embodiment shown in FIG. 1d, the post accelerator 48 comprises three stationary electrodes 181, 182, 183, instead of the two electrodes 51 and 52 of FIG. 1a, wherein each electrode again has a slot shaped aperture 49 as shown in FIG. 1c. The variable focusing effect in the x-direction is achieved by varying the voltage on the center electrode 182, which in turn varies the electric field gradient.

Upon emerging from the post-accelerator 48, the beam is still narrow in the x-direction but has experienced a diverging action in the y-direction as a result of the uncompensated space charge forces acting within the post-accelerator 48. The y-divergence is corrected by the y-focusing action produced when the beam enters and exits the fringing fields of the post-accelerator analyzer magnet 56. As described by H. A. Enge in *Deflecting magnets* (published in *Focusing of Charged Particles*, VII, Ed. A. Septier, Academic Press, New York 1967.) the focal length F associated with an ion beam passing through a fringing field at an angle α 59 with respect to the normal 61 of the effective field boundary 63 is given by $$F = \frac{L}{\theta \tan \alpha} \quad (2)$$

where L is the path length 47 through the magnet and Θ is the deflection angle 65. A positive angle α 59 as shown in FIG. 1a produces positive y-focusing and negative x-focusing. Because the x-dimension of the beam is much smaller than the y-dimension, the fringing fields affect the y-motion of the ions in the beam to a much greater extent than the x-motion.

An important feature of the preferred embodiment is the adjustable position of the post-accelerator analyzer magnet in the negative x-direction using a motor 57, as shown in FIG. 1a. The poles of the post accelerator magnet 56 are contoured so that when the magnet 56 is moved in the x-direction, the motion causes α 59 to increase and the path length L 47 through the magnet to simultaneously decrease, and according to Eq. 2 both effects reduce F, i.e., increase the focusing power. Conversely, moving the post-accelerator magnet 56 in the positive x-direction decreases the focusing power.

In order to accommodate the large y-dimension of the beam, and produce sufficient y-focusing, the post-accelerator analyzing magnet 56 has a small bending radius and a large gap compared with the path length described by the ions on passing through the magnet. In such instances, the fringing field focusing action is accompanied by substantial aberrations. The aberrations produce an asymmetrical distribution of ions in the x-direction within the beam as well as increasing the x-dimension of the beam at the target 16. For example, in an oxygen implanter an oxygen beam having an x-dimension of 90 mm without aberrations and with a more or less gaussian x-distribution of ions is distorted by the aberrations and expands to 100 mm in the x-direction along with a centroid shift in the x-direction of approximately 10 mm. In general, this second order aberration can be corrected by curving the entrance and exit pole boundaries of the post-accelerator analyzer magnet 56; however, since this magnet is moved back and forth in the x-direction, to achieve the y-focusing, another separate device must be added in order to correct the aberrations of the ion beam.

FIG. 1b shows a feature of the preferred embodiment, wherein a sextupole magnet 150 is positioned just after the dipole field of the post-acceleration analyzer magnet 56 and eliminates the aforementioned aberrations of the beam.

Six poles 152 are excited with alternate polarities (N,S,N,S,N,S) by current-carrying-coils 156. The poles are magnetically connected by a yoke 154. The field within the aperture of the sextupole increases in magnitude with the square of the distance from the z-axis and thus preferentially produces an x-deflection of those ions most distant from the z-axis.

Figure 2A:
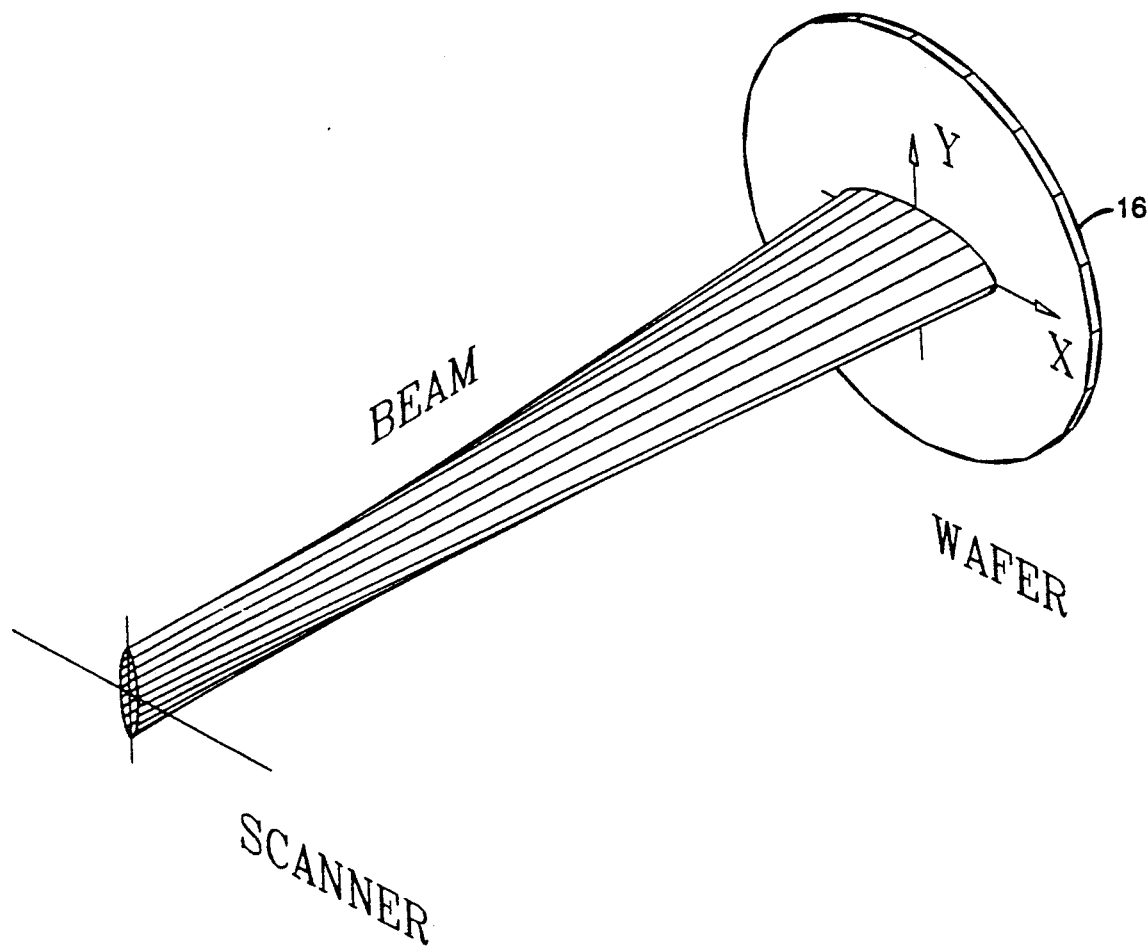
FIG. 2a shows for one aspect of the preferred embodiment, the progressive change in the cross-section of the beam as it passes from the scanner to the target.

FIG. 2a shows a typical transformation of the envelope of the ions within the beam as the beam passes from the scanner to the wafer. In the region of the scanner, the cross-section of the beam is narrow in the x-direction to enable the gap of the scanner 2 to be minimized as previously described. During passage to the wafer the y-dimension of the beam envelope does not change significantly but the x-dimension grows to become substantially larger than the y-dimension. The x- and y-dimensions at the wafer 16 are respectively controlled by the adjustable focusing actions of the post-accelerator 48 and post-accelerator analyzer magnet 56. The beam area ($\pi xy$) at the wafer 16 is made sufficiently large to avoid excessive local thermal pulsing charging, and ion induced damage, but with the y-dimension preferably smaller than the x-dimension to reduce the amount of overscan required.

Referring to FIG. 1, another aspect of the preferred embodiment, is the transport of the beam in a high vacuum, all the way from the ion source 32 to the target 16. The high vacuum condition is maintained inside a vacuum housing 17 by using standard high vacuum pumps.

Figure 4:
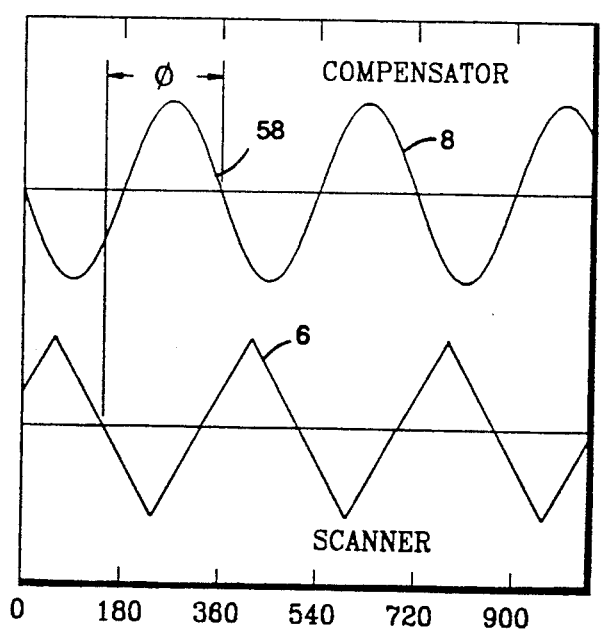
FIG. 4 is a diagram illustrating the synchronized phase relationship between the generally triangular scanner current waveform and the sinusoidal compensator current waveform produced by the preferred resonant excitation current for the compensator magnet.

Referring to FIG. 4, another important aspect of the preferred embodiment is the constant phase relationship that is maintained between the oscillatory fields 6,8 generated in the scanner 2 and compensator 4. This is necessary in order to achieve parallel scanning over the target 16 in which case the deflection of an ion produced in the compensator 4 must be equal and opposite to the deflection produced in the scanner 2. There are a number of routine methods for implementing phase synchronization. For example, the respective scanner and compensator controllers, 60, 62, of FIGS. 1 and 13, may be driven with phase-synchronized signals. Alternatively, the phase of scanner 2 may be locked to the measured phase of compensator 4. To obtain parallel scanning, the phase difference $\phi$ 58 between the oscillatory field 6 of scanner 2 and the oscillatory field 8 of compensator 4 must be proportional to the time of flight an ion takes on passing from the scanner 2 to the compensator 4. However, typically the flight time between scanner and compensator is less than 1 μsec and very much less than the periodicity of the oscillatory fields, in which case, for all practical purposes $\phi$ is 180 degrees.

Figure 5:
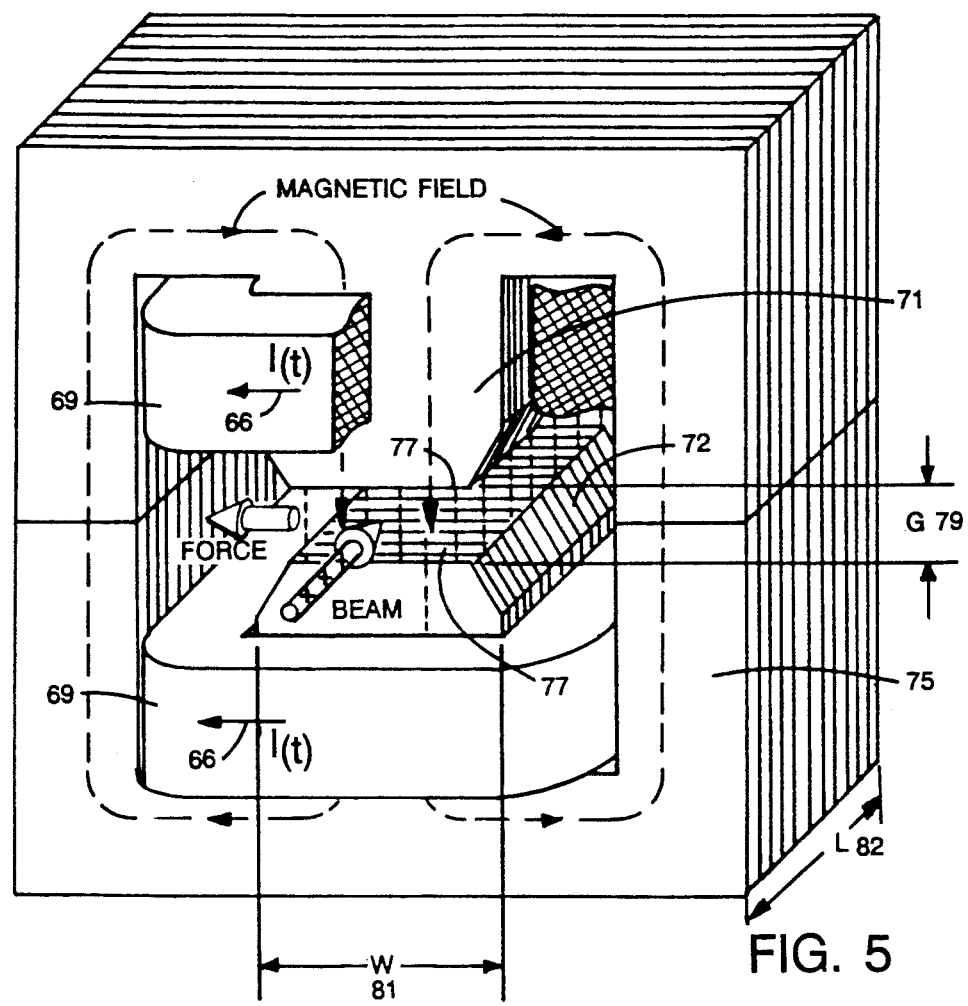
FIG. 5 is a diagrammatic illustration of a basic magnetic system employing a laminated pole and yoke useful for the preferred embodiment of FIG. 1.

FIG. 5. illustrates the basic structure of the scanner magnet 2 in the preferred embodiment wherein the oscillatory magnetic field 64 is generated in a magnetic circuit excited by an oscillatory current 66 passing through the turns of a pair of coils 68, each surrounding a pole 70 constructed of high permeability, thin ferromagnetic laminations 72 of thickness in the range of commercially available laminations, e.g., 0.2 and 1.0 millimeter, magnetically connected to each other by a yoke 74, also constructed from such high permeability, thin magnetic laminations. The facing surfaces 76 of the two poles, formed by the laminations, are usually parallel to each other and are separated by a gap 78 through which the ion beam passes. Within the gap a force acts on the ions in a direction perpendicular to both the direction of the magnetic field and the direction of the velocity vector of an ion. A suitably well defined magnetic field B in the pole gap is realized by making the dimension W of the pole width 80 at least 3 times as large as the dimension G of the pole gap 78, i.e., $W \geq 3G$. An important feature of the magnet in the preferred embodiment is the high relative magnetic permeability of the pole 70 and yoke 74 (at least 1000) which concentrates the magnetic energy almost entirely in the region of the pole gap 78, thereby minimizing the required field energy and electrical power needed to excite the magnets at a high frequency. The excitation power P required to generate a sinusoidal oscillatory angular deflection α, at a frequency f is, in MKS units:

$$P = 2.5 \times 10^6 f \frac{a^2 K^2 WG}{L} \tag{3}$$

where L is the effective length 82 of the magnet in the Z direction and K is the magnetic rigidity of the ion, given by $$K = \left( \frac{2ME}{Q^2} \right)^{\frac{1}{2}} \tag{4}$$

where Q is the ion charge. The advantage of using a ribbon beam and hence a small magnet gap G is immediately evident from Eq. 3 which shows that the power varies as the product of the width and gap, and in the limiting case of W=3G, as the square of the gap.

Equations 3 and 4 further show that the power P varies linearly with the mass M and therefore there is an extreme difference between the requirements for the magnetic deflection of heavy ions compared with those for electrons, e.g. for a given frequency and magnet dimensions, an oxygen ion beam requires 28,800 times as much power as needed for a comparable deflection of electrons of the same energy.

Figure 5A:
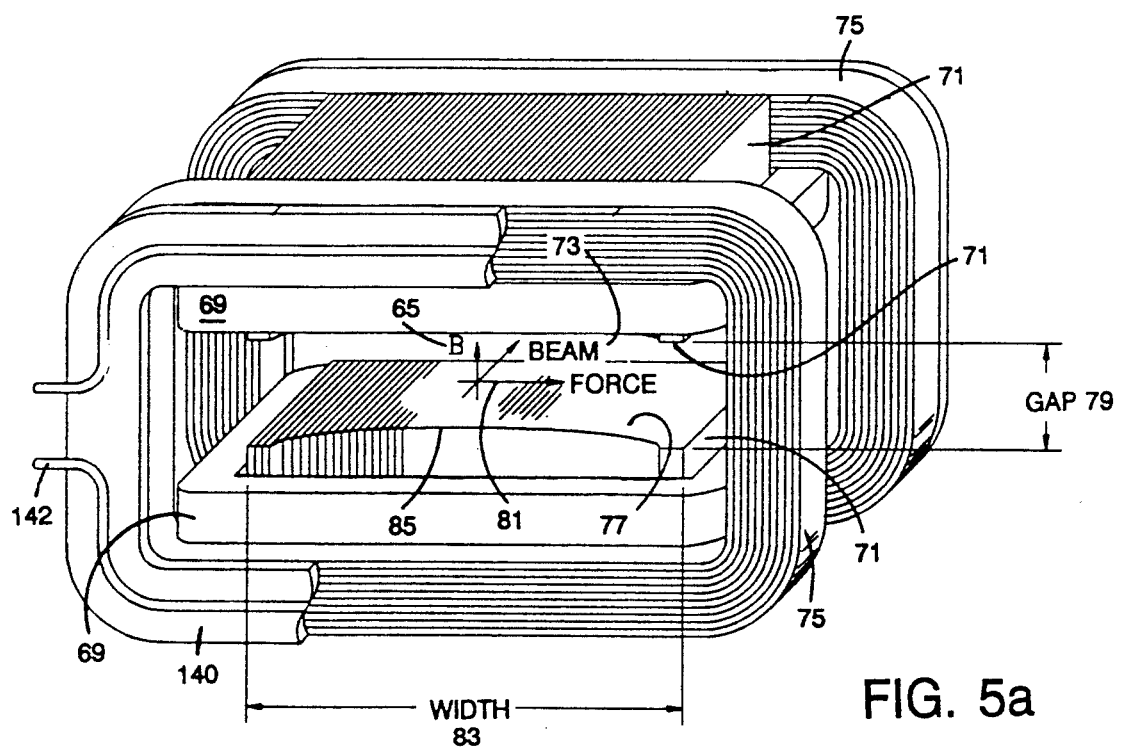
FIG. 5a is a diagrammatic three-dimensional view of detailed aspects of the magnetic structure of the compensator magnet showing two laminated coil-form yokes and crossed laminations for the design of the preferred embodiment.
Figure 5B:
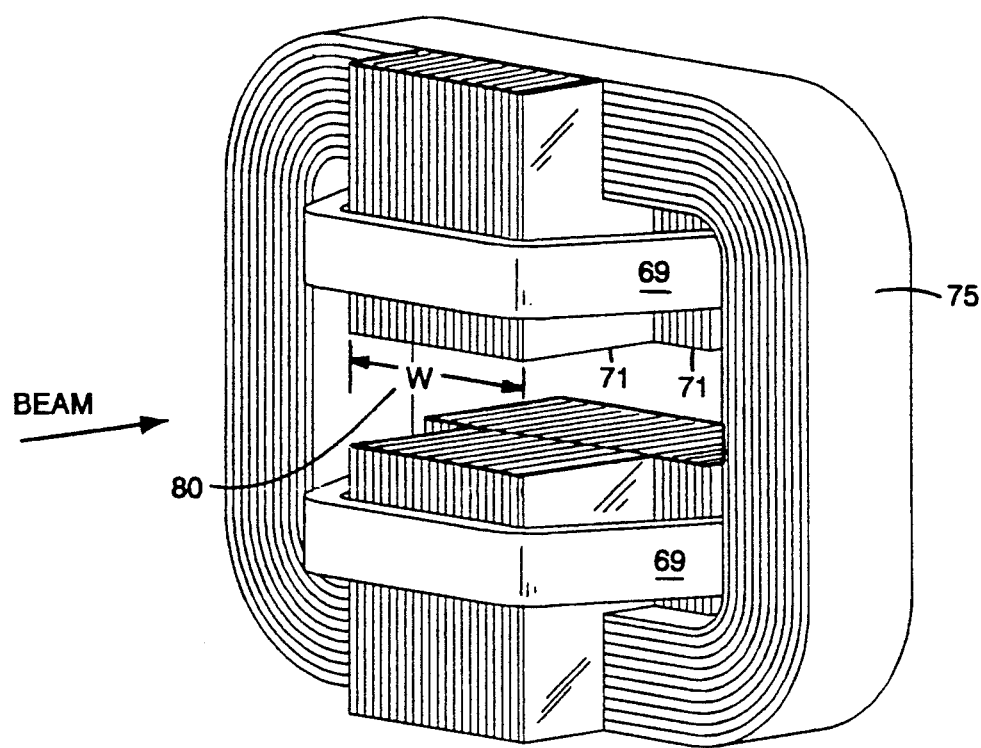
FIG. 5b is a further diagrammatic three-dimensional view of detailed aspects of the magnetic structure in an alternative embodiment, using a laminated coil-form yoke, and crossed laminations.

FIGS. 2 and 5b show another important aspect of the preferred embodiment, in which the field energy and operating power of the scanner are reduced by contouring or stepping the lateral sides of the pole so that its width 80 is as small as possible at the entrance where the beam does not deflect significantly in the y-direction, and is wider, at the exit end to accommodate the increased y deflection.

Figure 6:
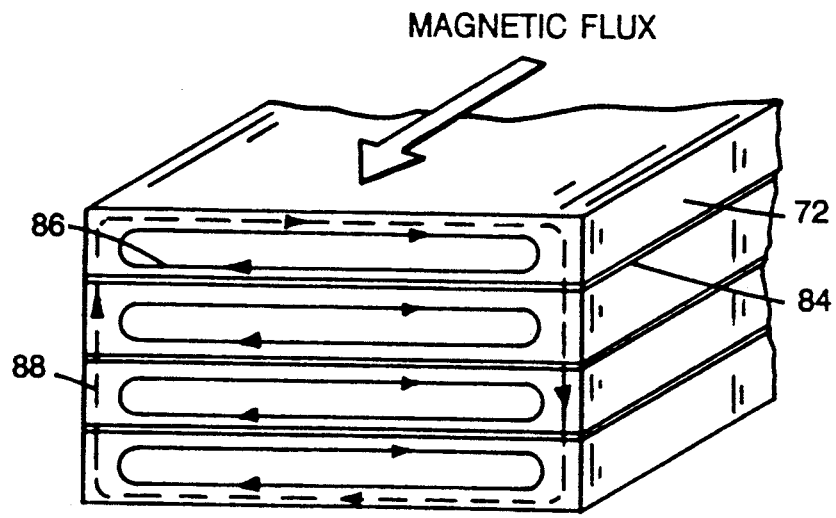
FIG. 6 is a diagrammatic illustration of the eddy current conditions induced in successive laminations of the preferred embodiment.
Figure 7:
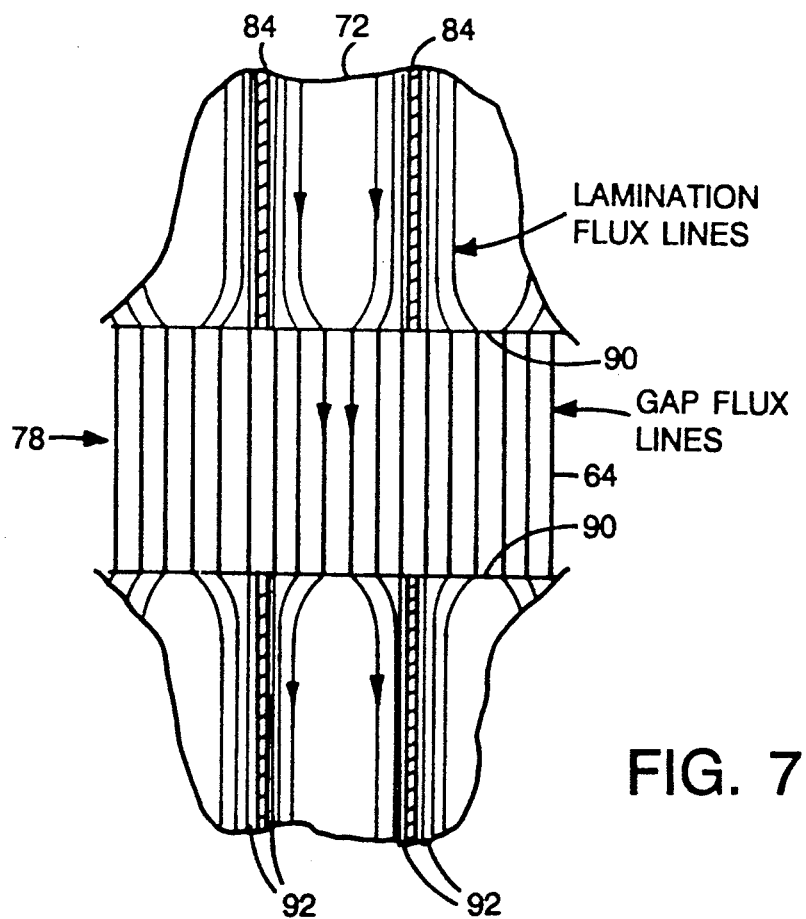
FIG. 7 illustrates the magnetic flux distribution in laminations and in the working gap between the pole pieces of the preferred embodiment.

FIGS. 6 and 7 further illustrate the preferred structure of the laminated magnets wherein the laminations 72 are electrically insulated from each other by a layer of insulating material 84. Eddy currents 86 generated from the time-varying magnetic field within the laminations 72 are forced to flow within the boundaries of each lamination and are prevented from flowing around the perimeter 88 of the pole and yoke. The eddy currents are in opposition to the coil current and cause the magnetic flux to be concentrated in the surface regions of the laminations as shown in FIG. 7. Within the thickness of the lamination, a sinusoidal magnetic field diminishes in magnitude approximately exponentially with distance from the lamination surface. At a depth $\delta$ called the skin-depth the field is 1/e of its magnitude at the surface where $\delta = (1/\pi\mu\sigma f)^{\frac{1}{2}}$, $\mu$ is the magnetic permeability of the lamination material, $\sigma$ is its electrical conductivity, and f is the sinusoidal frequency of the field B. The oscillatory field 6 in the scanner 2, however, is not in general sinusoidal, and more typically has a triangular variation with time, in order to achieve a uniform irradiance over the surface of the target 16. Such a waveform has many higher order harmonics—for example harmonics up to 2 kHz may be superimposed on a fundamental sinusoidal frequency of 100 Hz and up to 20 kHz at a fundamental frequency of 1000 Hz. At first sight it appears that an extremely thin (and in important cases, impractical) lamination is needed in order to accommodate the higher order harmonics. Indeed, the skin-depth $\delta$ is only $\approx 0.1$ mm at 2 kHz and $\approx 0.03$ mm at 20 kHz, whereas typical thicknesses of commercially available transformer steel are greater than 0.2 mm.

Figure 8:
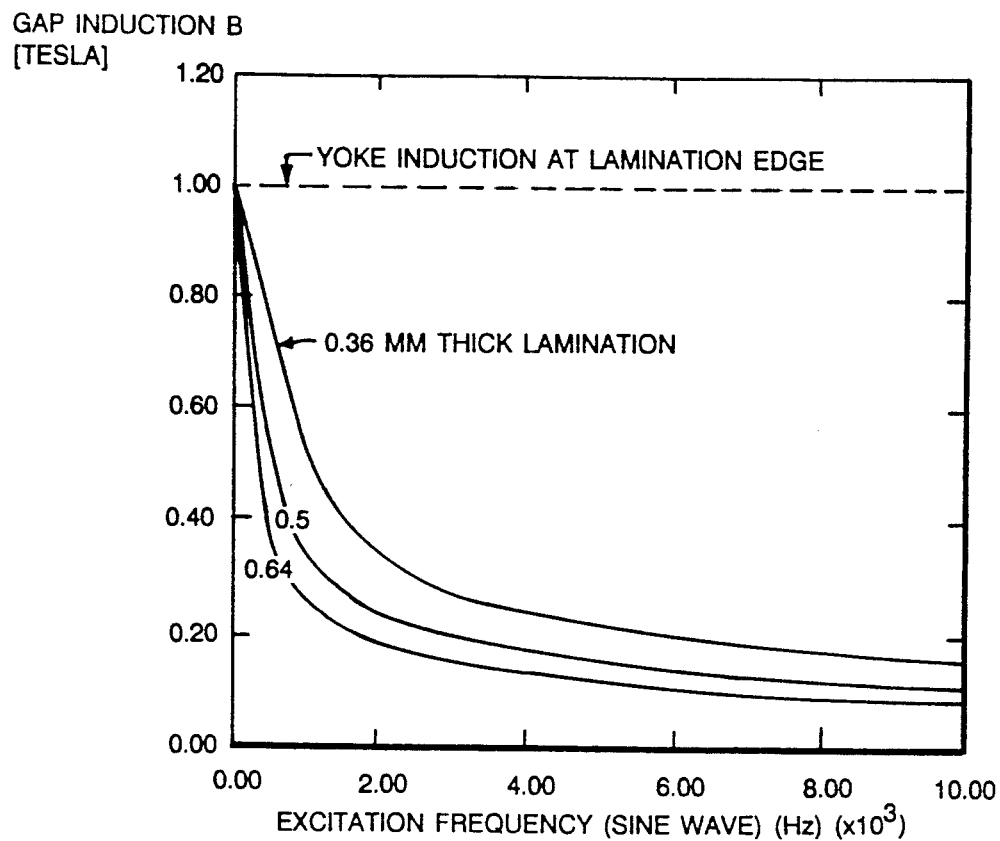
FIG. 8 is a graph showing the variation of gap induction B with sinusoidal frequency employing the laminations according to the invention.

However, we realize that for a triangular shaped waveform, the amplitude of the higher order harmonics decreases significantly with increasing frequency, and we further realize that transformer steel magnetically saturates at a very high field of 1 to 1.5 Tesla. We realize it is therefore possible to configure a practical, high frequency, scanner magnet with lamination material for the yoke 74 and the pole 70 of FIG. 5 that is substantially thicker than the skin depth of the high order harmonics, e.g., thickness in the range of 0.2 to 1 mm. Although not obvious, this remarkable aspect of the invention can be established quantitatively by taking into account the fact that the magnetic field is continuous across the normal to the high permeability pole surface 90 (refer to FIG. 7), in which case the field B 64 in the gap 78 is related to the field $B_s$ in the lamination material according to the expression:

$$B \approx B_s \frac{\delta}{d} \left( \frac{2(\cosh d/\delta - \cos d/\delta)}{\cosh d/\delta + \cos d/\delta} \right)^{\frac{1}{2}} \tag{5}$$

where d is the lamination thickness. FIG. 8 shows the variation of B with sinusoidal frequency up to 10 kHz, according to Eq. (5), for lamination thicknesses of d=0.36, 0.5, and 0.64 mm; $\sigma = 2.5 \times 10^6$ S/m; and $\mu = 7000 \, \mu_0$ where $\mu_0 = 4\pi \times 10^{-7}$ is the vacuum permeability. The curves conservatively apply to a saturation field $B_s$ of 1 Tesla within the lamination, and show that a field in the gap as high as 0.1 Tesla is possible at a frequency of 10 kHz. The validity that a practical magnet is possible with typical commercial lamination thickness is finally established in FIG. 9, where for the case of 0.5 mm thick laminations, the amplitude of a triangular wave 89, obtained by adding the first 11 odd order harmonics to the fundamental frequency, is no more than 20% less than a pure sine wave 91 having a frequency equal to the fundamental frequency of the triangular wave. Furthermore, even at a fundamental frequency as high as 500 Hz, a gap field of 0.5 Tesla can be realized. Indeed, in this frequency regime, the fields that can be achieved with a laminated structure are higher than those obtainable using present day ferrites, an alternative more expensive material for constructing the magnets that is an electrical insulator and free of eddy currents, but magnetically saturates at only 0.3 to 0.4 Tesla. A triangular waveform is advantageous since it causes a beam to scan back and forth at a constant speed, producing a uniform irradiance if the wafer is simultaneously reciprocated at constant speed in an orthogonal direction.

Figure 10:
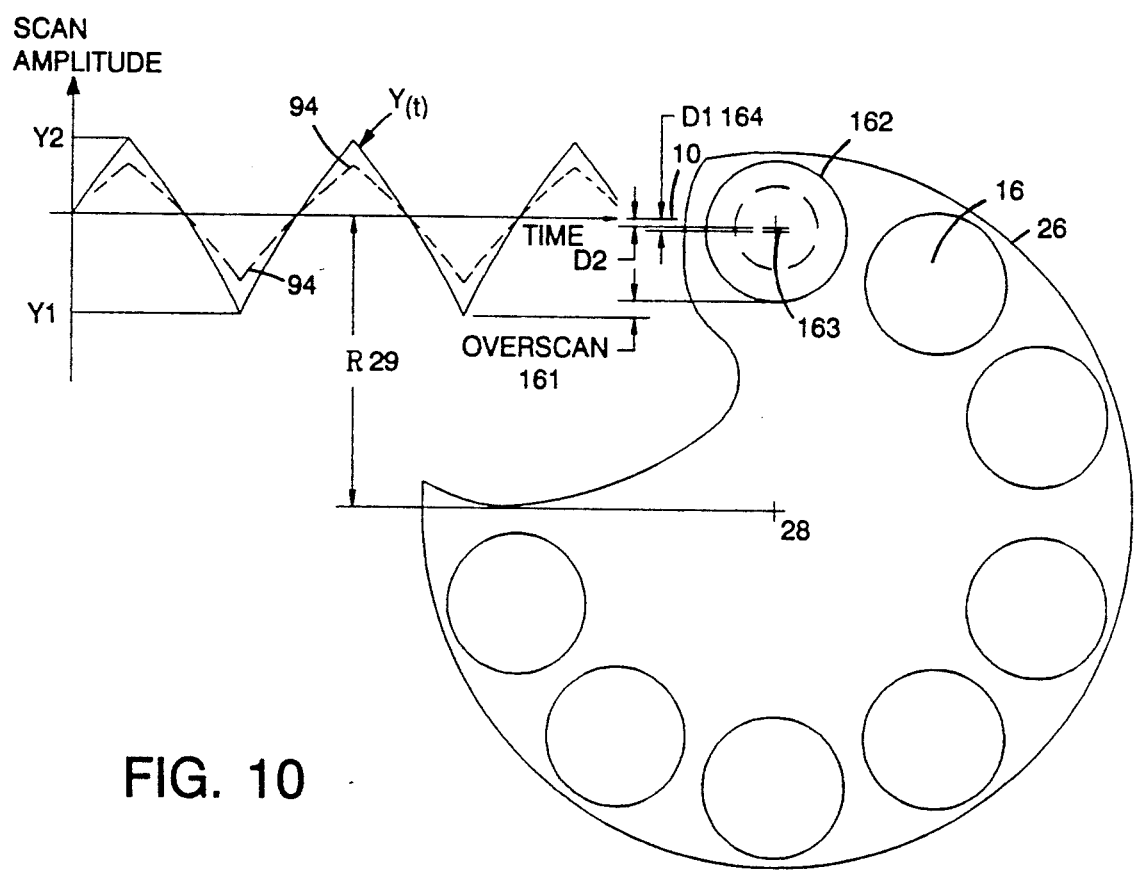
FIG. 10 illustrates positions of wafers in relation to the preferred excitation waveform that produces differences in scan velocity to compensate for variations in radial distance of portions of the scanned beam from the center of rotation of the rotatable wafer carrier of FIG. 1 that carries the wafers under the beam.

In accordance with Fourier transform theory, it is possible to synthesize quite general shaped oscillatory waveforms. For example, FIG. 10 shows the result of adding appropriate even order harmonics to a triangular waveform to produce a scan velocity that is slower at one end 94 of the scan range than it is at the other end 96. This type of waveform contains the radial correction that is necessary to produce a uniform irradiance when the wafers of size as large as 12" are mounted on a carousel 26 rotating about an axis 28 as shown in FIG. 2. In such a case, points on the wafer surface most distant from the axis travel at a higher peripheral speed than points nearer the axis. This is compensated for by shaping the predetermined excitation wave form to make the beam dwell longer at the outer radii than at the inner. In practice, the beam is scanned with sufficient amplitude so as to not impinge on the wafer at the extremities of the scan range, during which time the direction of scan is reversed. The time needed to reverse the scan direction, in the over-scan region, depends on the harmonic response of the magnet and the slew rate of the driving amplifier. For typical, presently available high power commercial amplifiers, the slew rate is approximately 40 to 80 μsec, and is thus comparable to the response relamination time of the laminated magnet structures described in the preferred embodiment. FIG. 10 illustrates the adjustment of the wave form and placement of the wafers 16 on the carousel 26, according to the diametral size of the wafers.

FIG. 5a shows the structure of the compensator magnet 4. The basic components are similar to the scanner magnet 2 described in FIG. 5. Indeed, in the compensator magnet 4 each of a pair of coils 69 surrounds a laminated pole 71, and the two poles are magnetically connected via a pair of laminated yoke structures 75. The facing surfaces 77 of the poles are usually parallel to each other and are separated by a gap 79 through which the ion beam passes and becomes deflected in the transverse direction 81 by the magnetic field 67 which is oriented in a direction orthogonal to the pole surfaces 77. The poles 71 and yokes 75 are constructed of insulated laminations as previously described and shown in FIGS. 6 and 7.

FIG. 5a illustrates a further important aspect of the invention, concerning an advantageous structure for a laminated magnet, whereby the physical size and weight of the magnet can be substantially reduced by using crossed (orthogonal) lamination planes in separable pole 71 and yoke 75 structures. Such a crossed lamination structure is particularly important in the case of the compensator 4 which must have a sufficient pole-width 83 to accommodate the y-deflection produced by the scanner 2 as shown in FIG. 2, e.g., in order to scan a 12 inch wafer, the pole width is typically 16 to 20 inches wide. An integral H-frame structure of the configuration shown in FIG. 5 would result in laminations of a very large area. However, we have realized that by using the crossed lamination configuration shown in FIG. 5a, that at the interface surfaces between a pole 71 and the yokes 75, the magnetic flux passing through a single lamination of the pole 71 becomes distributed more or less equally in all of the laminations of the yokes 75, through which it proceeds, and conversely, at the interface with the opposite pole, the magnetic flux in a single lamination of yoke 75 becomes distributed more or less equally in all of the laminations of the pole through which it enters. As a consequence, the dimensions and configuration of the yokes 75 can be selected independently of dimensions and configuration of the poles 71, subject only to the constraint of having a sufficient total cross-sectional area in the yokes 75 in order to collect the total magnetic flux from the pole 71 without incurring magnetic saturation in the yokes 75. Also, by making use of interfaces with crossed laminations it is possible to orient the pole laminations so as to be normal to the entrance and exit faces of the magnet (i.e., parallel to the z-axis 10 of FIG. 1) which is the preferable orientation for the purpose of introducing contours on the pole edge 85 and avoiding peeling and delamination. The advantage of introducing certain pole-edge contours is discussed below in connection with other aspects of the invention.

FIG. 5a also shows the addition of cooling plates 140, fitted with the cooling tubes 142 to remove the heat generated by the eddy currents within the laminations. The cooling plates are electrically insulated from the laminations and are bonded to make good thermal contact with edges of the laminations. Similar cooling plates can be bonded to the lamination edges of the pole. The power dissipation within the laminations depends on the square of the magnetic field and the square of the frequency and is typically in the range of 0.5 to 2 watts per kilogram of lamination material. The cooling plates are typically capable of removing 0.6 to 1 watt per cm² for temperature rises in the laminations of 12° to 20° C.

In another embodiment, as shown in FIG. 5b, the magnetic structures of the scanner 2 and compensator 4 are built using the above-described cross-lamination technique but have the yoke 75 formed by only one laminated coil and the pole pieces 71 formed by two laminated sections. The magnetic flux passing through a single lamination of the yoke coil is distributed in all of the laminations of the pole sections. The individual sections of each pole piece are also partly magnetically coupled to each other. The two-part construction of each pole enables a step-wise increase in the pole width which is advantageous in scanner 2 for the purpose of minimizing the excitation power as previously discussed.

Figure 5C:
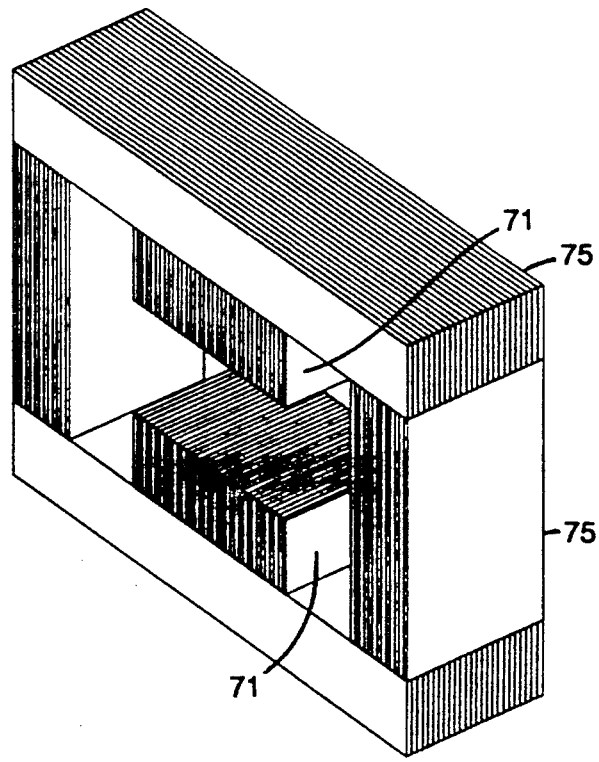
FIG. 5c is a further diagrammatic three-dimensional view of the magnetic structure using laminated blocks and crossed laminations.

In FIG. 5c blocks of flat laminations are arranged to define a pole and yoke assembly, as an alternative mode of employing the crossed laminations feature. Yoke cooling plates 140 of the type shown in FIG. 5a can be bonded to the edges of the laminations to remove the thermal power generated in the laminations.

FIG. 11 illustrates another important aspect of the invention in which the compensator 4 is resonantly excited by parallel connection of its excitation coils 69 to a tank capacitor 98, and a coupling capacitor 100 in series connection with a power amplifier 102 driven by a sinusoidal wave 101. When the compensator is excited at the resonant frequency f, where $$f = \frac{1}{2\pi\{L(C_c + C_t)\}^{\frac{1}{2}}} \tag{6}$$

L is the inductance of the scanner magnet, $C_c$ is the coupling capacitance, and $C_t$ is the tank capacitance; it is only necessary for the amplifier 102 to deliver power to meet the resistive losses in the system, such as the ohmic losses in the coils (and capacitors), the ohmic losses associated with the eddy currents in the laminations, the magnetic hysteresis losses in the laminations, and the internal losses in the amplifier 102. The amplifier does not need to provide the much higher reactive power associated with the oscillating magnetic field energy in the gap of the compensator magnet 4. For a typical compensator, an unloaded circuit quality factor Q=20 can be achieved, in which case a reactive power of 100 kVA can be generated with just a 5 kVA power amplifier. The ratio of the coupling capacitance $C_c$ to the tank capacitance $C_t$ is adjusted to match the input impedance of the resonant circuit to that of the power amplifier 102 for maximum power transfer. The input impedance is $C_t^2/2\pi fQC_c^2(C_c+C_t)$ where f is the resonant frequency and typically $C_c \approx 1/5C_t$. The magnetic energy of the compensator 4 is typically an order of magnitude greater than that of the scanner because the pole width 106 must be of large enough dimension to accommodate the y deflection of the beam produced in the scanner 2, as is evident in FIG. 2. It is a part of the preferred embodiment, and advantageous to operate the compensator with resonant excitation, to greatly reduce the power requirements of the driving amplifier 102. Resonant excitation of the compensator generates an essentially pure sinusoidal oscillatory field $B_2(t)$ as a function of time t, where $$B_2(t) = B_2 \sin 2\pi ft. \tag{7}$$

Another aspect of the preferred embodiment concerns the dependence of the oscillatory field $B_1(t)$ of the scanner 2 on time t. The time dependence finally controls the scan velocity at the target. For this reason the scanner is not usually operated in a resonant mode for then the scan velocity at the target can only be sinusoidal in nature and in general this is not useful for producing a uniform irradiance over the target surface, which in most cases is either reciprocating or rotating about an axis. Indeed in the preferred embodiment the scanner is excited with a selectable, and usually more or less triangular waveform. For the case of a constant scan velocity over the scan range the beam position Y must vary linearly with time, i.e.

$$Y(t) = 4fY_o t \qquad \left(-\frac{T}{4} \leq t \leq \frac{T}{4}\right) \tag{8}$$

where $T = 1/f$ is the oscillatory period and $Y_0$ is the mean scan amplitude. On the other hand, referring to FIG. 2 for the case when the target 16 is mounted on a carousel 26 rotating about an axis 28 parallel to the z-axis 10, a uniform irradiance requires the scan velocity Y to be radially corrected such that it varies inversely as the distance of the beam center 29 from the carousel axis 28, i.e.

$$\dot{Y} = \frac{k}{Y + R} \tag{9}$$

where k is a constant depending on the scan range and periodicity T, and R is the distance between the carousel axis 28 and the z-axis 10. Integrating Eq. (9) leads to the results $$Y(t) = (R^2 + kt)^{\frac{1}{2}} - R \qquad \left(-\frac{T}{4} \leq t \leq \frac{T}{4}\right) \tag{10}$$

$$k = 4fY_o(Y_2 + Y_1 + 2R) \tag{11}$$

where $Y_1$ and $Y_2$ are the minimum and maximum excursions made by the beam, with respect to the carousel axis 28, occurring at times $t = \pm T/4$, and $Y_0 = (Y_2 - Y_1)/2$ is the mean scan amplitude. The magnitudes the scan amplitudes $Y_1$ and $Y_2$ are set to be as small as possible but sufficiently large to provide an appropriate overscan region 161 at each extremity of the scan, for a given size wafer 162 as shown in FIG. 10. Because the waveform Y versus t is not symmetrical about $Y = 0$ the wafer centers 163 are located at a pitch circle radius that is less than the distance R 29 between the z-axis 10 and the carousel axis 28 by an amount D1 164 as shown in FIG. 10. For smaller diameter wafers the scan amplitudes $Y_1$ and $Y_2$ may be reduced as shown in FIG. 10. The distance D1 is also reduced to D2 as shown. The relationship between the field $B_1$ and the beam position Y depends on the details of the respective pole boundaries of the scanner 2 and the compensator 4, the distance between the two scanners, and the magnetic rigidity K (see Eq. 4) of the ions in the beam. In general, it is straightforward to find the field $B_1(t)$ as a function of time or phase angle $\phi = 2\pi ft$ using standard mathematical iteration techniques such as the Newton or Secant method, for example see equation 25. For typical arrangements, the dependence is predominantly linear, in which case it is appropriate to write $$B_1 = aKY(1 + \epsilon_1 Y + \epsilon_2 Y^2 + \ldots) \tag{12}$$

where 'a' is a constant and $\epsilon_1, \epsilon_2, \ldots$ are small compared with unity. This last equation defines the required time dependence of $B_1$ via the time dependence of Y as given in Eqs. 8 and 10, for achieving a prescribed scan velocity across the target.

Another important aspect of the invention, included in the preferred embodiment, concerns resonant excitation and the contour of the effective field boundary 108 of the pole of the compensator 4 as shown in FIG. 12, in relation to generating a parallel scanned beam, i.e. one in which the principal axis 110 of the beam, after emerging from the compensator 4, is oriented in a direction parallel to the z-axis 10. The path length of the principal axis of an ion beam intersecting the entrance side of the boundary 108 at a point P 112 and emerging at a point Q 114, must be sufficient for the beam to deflect by an equal but opposite angle to the deflection angle $\theta$ 115, produced by the scanner 2. Inasmuch as the flight time of an ion passing through either the scanner 2 or the compensator 4 is very small compared with the periodicity of the oscillating fields 6,8, the oscillatory fields may be regarded as constant for the purpose of describing an ion trajectory at a given instant of time t. Furthermore, if the compensator 4 has a uniform pole gap, the path from the entrance to exit field boundary is a circular arc of constant radius given by $$\rho = \frac{K}{B_2}. \tag{13}$$

in which case it follows that $$s = \rho\theta = \rho\frac{Y}{d} \tag{14}$$

where d is the effective distance 113 between the scanner 2 and compensator 4 as defined in FIG. 12. Since d varies only slightly with Y it can be expressed as $$d = d_0(1 + \alpha Y + \beta Y^2 \ldots), \tag{15}$$

where $\alpha$ and $\beta$ are small compared with unity. Substituting Eqs. 7 and 8 into 13 gives the required bending radius $\rho$ as a function of Y in order to produce parallel scanning at a constant velocity:

$$\rho = \frac{K}{B_2} \cdot \frac{1}{\sin\{\pi/2(Y/Y_o)\}} \tag{16}$$

Similarly, substituting Eqs. 7 and 10 into 13, gives the corresponding result for producing a parallel scan with radial velocity correction:

$$\rho = \frac{K}{B_2} \cdot \frac{1}{\sin\{\pi/2(Y/Y_o)\eta\}} \tag{17}$$

where $\eta$ is the radial correction factor $$\eta = \frac{(2R + Y)}{(2R + Y_1 + Y_2)} \quad (18)$$

Equation 14 combined with 15 and 16 define the locus $(s,\rho)$, in terms of the output beam position Y, of the entrance contour relative to the exit contour of the effective field boundary 108 of the compensator. The exit boundary 109 can be chosen somewhat arbitrarily, either planar or curved. FIG. 12 shows as an example a planar boundary parallel to the y direction. In order to satisfy the criteria of Eqs. (16) or (17), which relates the contour of one boundary to the other at least one of the boundaries has to be curved and typically concave. In applying the locus equations it should be kept in mind that d is weakly dependent on Y according to Eq. 15. As the ion species or energy is changed the Eqs. 12 through 18 show that only the oscillatory field amplitudes $B_1$, and $B_2$ need to be adjusted by adjusting the excitation currents in proportion to the magnetic rigidity K of the ion defined in equation 4 in order to retain the parallel scanning condition. The $(s,\rho)$ locus of the effective field boundary of the compensator can be similarly derived for other scan versus time profiles corresponding to different types of mechanical scanning of the wafer.

FIG. 12 shows another aspect of the preferred embodiment concerning the contour of the effective field boundary of the scanner and the control of the beam size as the beam scans across the target 16. The entrance boundary 116 of the scanner 2 is normal to the z-axis 10, in which case the fringing field associated with the boundary 116 does not affect the beam size at the target 16, regardless of the direction of deflection of the beam ($+y$ or $-y$). The exit boundary 118 of the scanner is in general contoured but symmetrical about the z-axis. Again, the fringing field associated with the exit boundary 118 does not affect the beam size at the target if the boundary is convex in such a way as to always be normal to the principal axis 12 of the deflected beam. However, an exit boundary that is too convex produces a negative optical power in the yz-plane, normal to the principal axis 12, and a positive optical power in the orthogonal x-direction, according to Eq. 2. Conversely, a less convex, plane, or concave boundary, has positive and negative optical powers in the two respective directions. A non-zero optical power in the fringing fields generally affects the beam size at the wafer 16. The contour of the exit boundary of the scanner is selected so that in conjunction with the optical effects of the fringing fields of the compensator, the size and angular deviation within the beam remains approximately constant as the beam scans across the wafer 16. Even though it is theoretically impossible to achieve absolute constancy of the size and angular deviation of the beam, the variations are generally small and quite tolerable. Indeed, for the typical values L= 0.25 m, $\alpha = \theta$-(max)= 10°, Eq. 2 gives a focal length of F≈20 m, which is optically very weak. For example, an ion entering the field and displaced 10 mm from the principal axis is changed in direction by only 0.5 milliradian. This compares with an intrinsic angular deviation within the beam of typically 5 to 10 milliradians.

Figure 13:
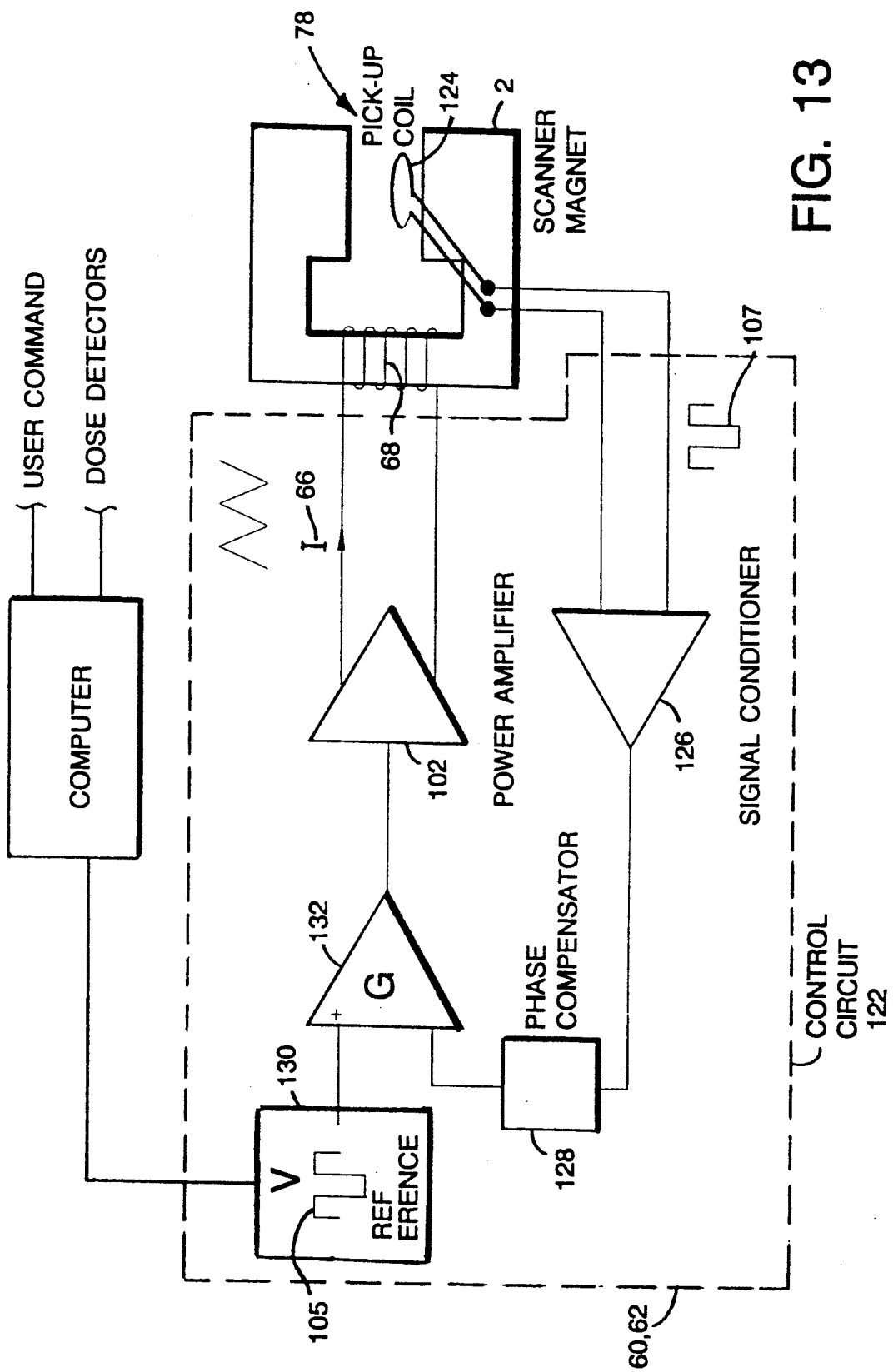
FIG. 13 is a schematic illustration of a preferred electronic control circuit used to excite the oscillatory magnetic field in the magnets of the scanner and compensator devices of the embodiment of FIG. 1.

FIG. 13 shows schematically the electronic control circuit used to excite the oscillatory magnetic field in the magnets 2 and 4 of FIG. 1. A separate circuit and pickup coil is used for each magnet. The circuits include a feedback loop, such that the amplitude and phase and waveform shape of the oscillatory magnetic field is controlled to cause the beam 22 of FIG. 2 to scan back and forth across the target 6 in a manner that generates a prescribed irradiation dose with a prescribed overscan region outside the target perimeter. In the case when the compensator 4 is resonantly excited a sine wave 101 is used as the input to the power amplifier 102 as shown in FIG. 11. A pick-up coil 124 is still used however to control the amplitude and phase of the oscillatory field in the compensator 4.

The control circuit 122 of FIG. 13 functions in the following ways: a voltage signal generated by the time varying magnetic field passing through the pickup coil 124 placed, e.g. in the gap 78 of the scanner magnet 2, is fed into a signal conditioner 126 followed by a phase compensator 128, and this resulting signal is subtracted from a reference waveform signal 130 to generate an error voltage, reflective of an error in the dosage being applied to the substrate. The error voltage is integrated and amplified with an appropriate gain G by an amplifier 132, and the resulting signal is added to the reference signal and applied to the input terminals of a power amplifier 102 which delivers a current I 66 to the coils 68 of the scanner magnet 2. The reference signal 130 represents the desired waveform that is required for the voltage across the coil of the scanner magnet 2. The pickup coil 124 delivers a voltage signal to the signal conditioner 126 which is passing through the pickup coil 124, namely $$V_c = nA \, dB/dt \quad (20)$$

where A is the area of the pickup coil 124 and n is the number of turns in the pickup coil 124.

The power amplifier 102 as shown in FIG. 13 operates as a voltage amplifier because it amplifies the voltage of the signal input given to it. The voltage V that this amplifier delivers to the coils 68 of the scanner magnet 2 is related to the current 66 that flows through the coils 68 of the scanner magnet 2 according to the following equation, $$V = L \, dI/dt + IR \quad (21)$$

where R is the ohmic resistance of the coils of the scanner magnet 2 plus the load resistance representing the power losses in the laminations of the scanner magnet 2 resulting from the eddy currents and the magnetic hysteresis in the laminations and yoke, and L is the electrical inductance of the scanner magnet 2.

The magnetic field in the gap 78 of the scanner magnet 2 is approximately proportional to the current 66 flowing through the coils 68 of the scanner magnet 2 neglecting for the moment the small magnetic reluctance of the yoke structure of the magnet. Correspondingly, the rate of change of the magnetic field is proportional to the rate of change of current through the coils. Namely, $$dB/dt \approx (\mu_o N/G) \, dI/dt \quad (22)$$

where N is the number of turns in the magnet coil 68 and G is the dimension of the gap 78 of the magnet. To the extent that the inductive term in Eq. (21) is very much greater than the resistive term, it follows that the voltage across the coil, V, is approximately equal to $$V \approx (GL/\mu_o N) \, dB/dt. \quad (23)$$

Substituting Eq. (20) into Eq. (23) then leads to $$V \approx GLV_c/(\mu_o NAn). \tag{24}$$

Thus it follows that the voltage V that must be applied to the magnet coils 68 by the power amplifier 102 to achieve uniform dosage is proportional to the voltage $V_c$ detected by the pickup coil 124.

This simple relationship is only approximate and the signal conditioner 126 and phase compensator 128 are necessary in order to deliver to the power amplifier 102 a signal that exactly relates to the voltage that must be delivered to the coils 68. The signal conditioner 126 conditions the signal by adjusting the gain and shape of the signal and also eliminates any distortions of the signal associated with the circuitry. The phase compensator 128 is needed because there is always a phase shift arising from electronic delay times. There is also a phase shift between the current and magnetic field of the scanner magnet as a result of the finite permeability of the yoke material.

The signal from the pickup coil 124 is proportional to the time rate of change of the magnetic field in the magnet 2. The scan velocity of the beam across the target 16 is also nearly directly proportional to the rate of change of magnetic field in the scanner magnet 2 according to Eq. 12. Thus the signal from the pickup coil 124 is a direct measure of the scan velocity of the beam across the target 16. The dose delivered to the target per unit time, is proportional to the reciprocal of the scan velocity, and therefore the reciprocal of the voltage signal $V_c$ measured in the pickup coil 124. The deflections given to the ions are generated purely from magnetic fields. Electric fields, being absent, do not cause any perturbation of this condition. Thus, an advantageous feature of the preferred embodiment is the fact that the dose uniformity can be precisely controlled by the circuit of FIG. 13. The deviations from the desired dose profile will correspond to deviations from the corresponding voltage profile and can be continuously corrected during operation by adjusting the reference signal 130 via the control computer 199.

The power amplifier 102 may be operated as a current rather than voltage amplifier wherein it delivers to the scanner magnet 2 a current that is proportional to its input current. Rather than the more or less square wave voltage reference signal 130 illustrated in FIG. 13, a more or less triangular waveform of the type in FIG. 10 is used as a reference signal. The signal conditioner 126, in accord with Eq. (20), integrates the signal from the pickup coil 124 to generate the waveform to be compared with the reference signal.

With electrical deflection systems, the scan velocity can be monitored, at least in principle, by measuring the rate of change of voltage applied to the electrical deflection plates. However, as the beam currents become higher and space charge forces become greater, the voltage signal measured from these deflector plates is no longer simply related to the scan velocity that the electric field between the plates generates with the beam. In fact, at some current the scanning action deteriorates almost completely. For beams with a high perveance $(I/E^{3/2})$, it would not be possible to have a feedback system analogous to that described in FIG. 13 that reliably controls the dose uniformity.

Figure 22:
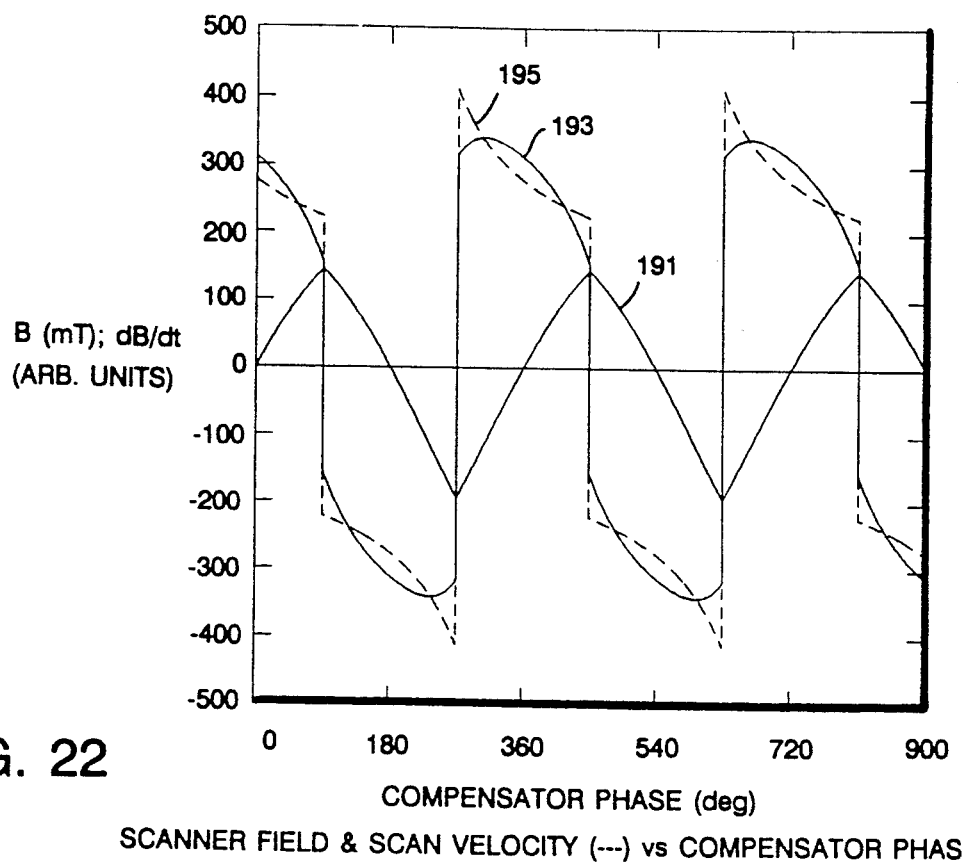
FIG. 22 shows the scanner waveforms and scan velocity at the wafer for the SIMOX application of the preferred embodiment.

The preferred embodiment makes use of modern high-speed digital electronics to implement the feedback loop as described in FIG. 13. The analog signal from the pickup coil is digitized and the phase compensation and signal conditioning is then carried out digitally. Correspondingly, the reference signal is synthesized digitally. The digital implementation has the advantage of being able to operate the feedback loop in a precise mathematical way, avoiding the instabilities that are often present in a pure analog feedback circuit. Moreover, the synchronized phase relationship between the oscillating field 6 of the scanner 2 and the oscillating field 8 of the compensator 4 (refer to FIG. 1), as previously discussed and shown in FIG. 4, is implicitly assured when digital synthesis is used for generating the wave forms. The data necessary for the proper generation of the waveforms, amplitudes, and phases of the synchronized reference signals for the scanner controller 60 and the compensator controller 62 are derived from a control computer 199 as shown in FIGS. 1 and 13. The precise nature of the reference waveforms depends on the dose monitoring information as well as the particular parameters and alternatives selected for the embodiment. For example, if both the scanner and compensator are excited directly, then for the case of a reciprocating wafer the voltage reference waveform is more or less a square wave. On the other hand, if the compensator is excited by a resonant circuit its reference waveform is sinusoidal. Some deviations occur from a square voltage wave (or triangular current wave) for a radial compensated scan as previously described and as shown in FIG. 22. In general, when synthesizing the waveforms it is necessary to pay attention to the harmonic responses of the magnets 2 and 4 and power amplifiers 102, and these responses must be adequate over all but the extremities of the scan range. At the extremities, the beam is in the overscan region, and it is not important if the scan velocity does not precisely follow the input waveform, for this does not affect the uniformity of the irradiance upon the wafer 16 surface.

Figure 9:
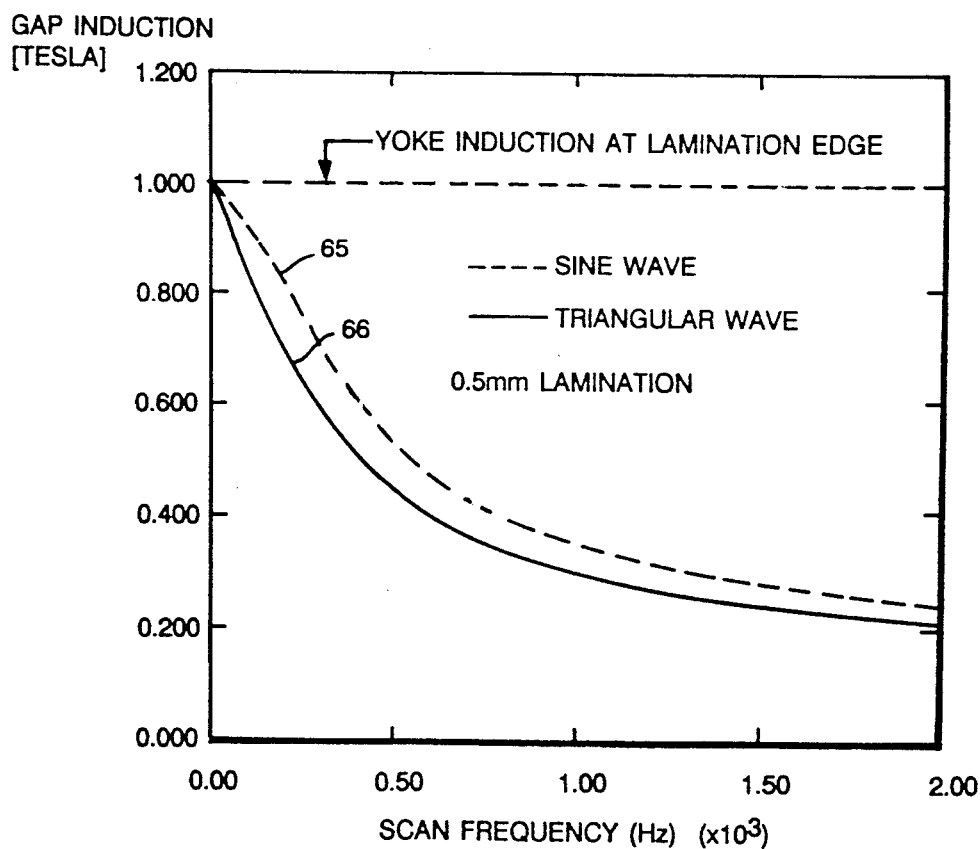
FIG. 9 is a graph showing the gap induction for a triangular wave form compared with a sinusoidal wave form and which establishes the practicality of the invention in respect of laminations of 0.5 mm thickness.
Figure 14:
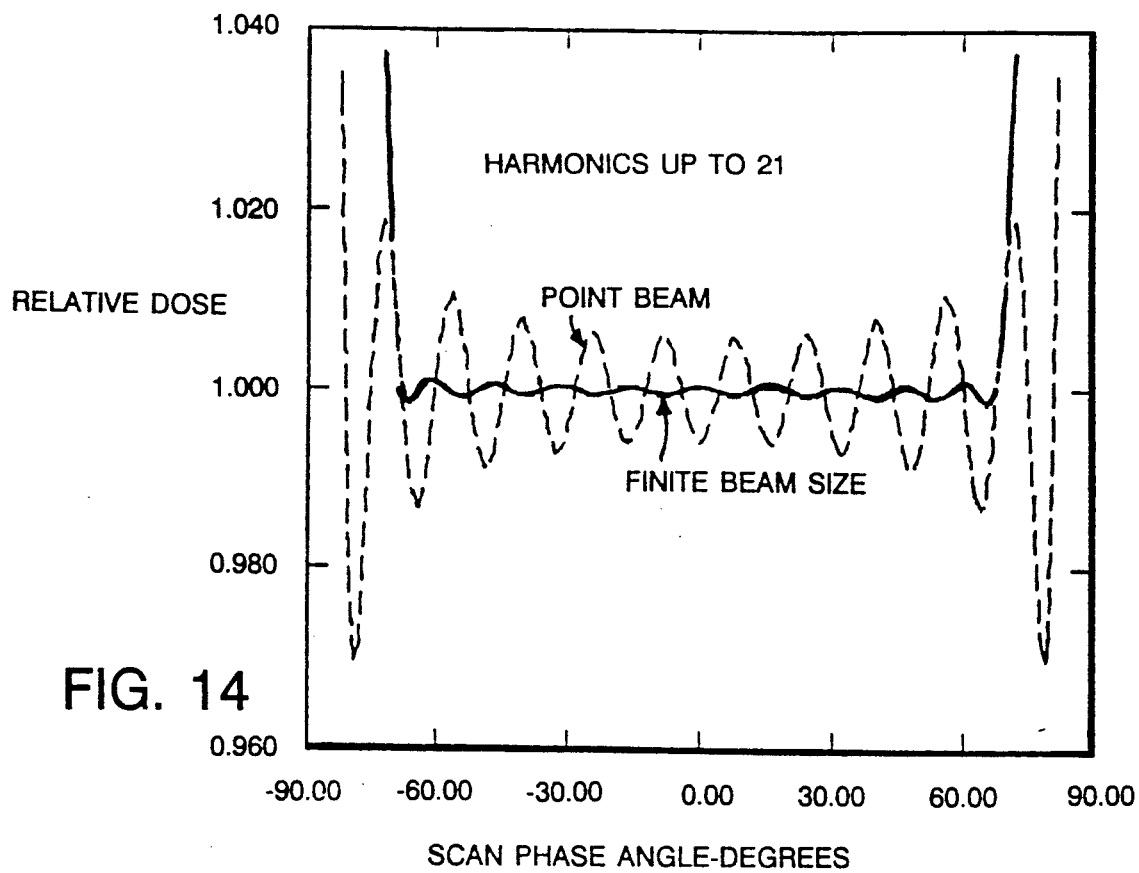
FIGS. 14 and 15 are plots illustrating the attenuation of fluctuation in dose uniformity achieved by the finite beam widths used by the system of claim 1 under respectively different conditions.
Figure 15:
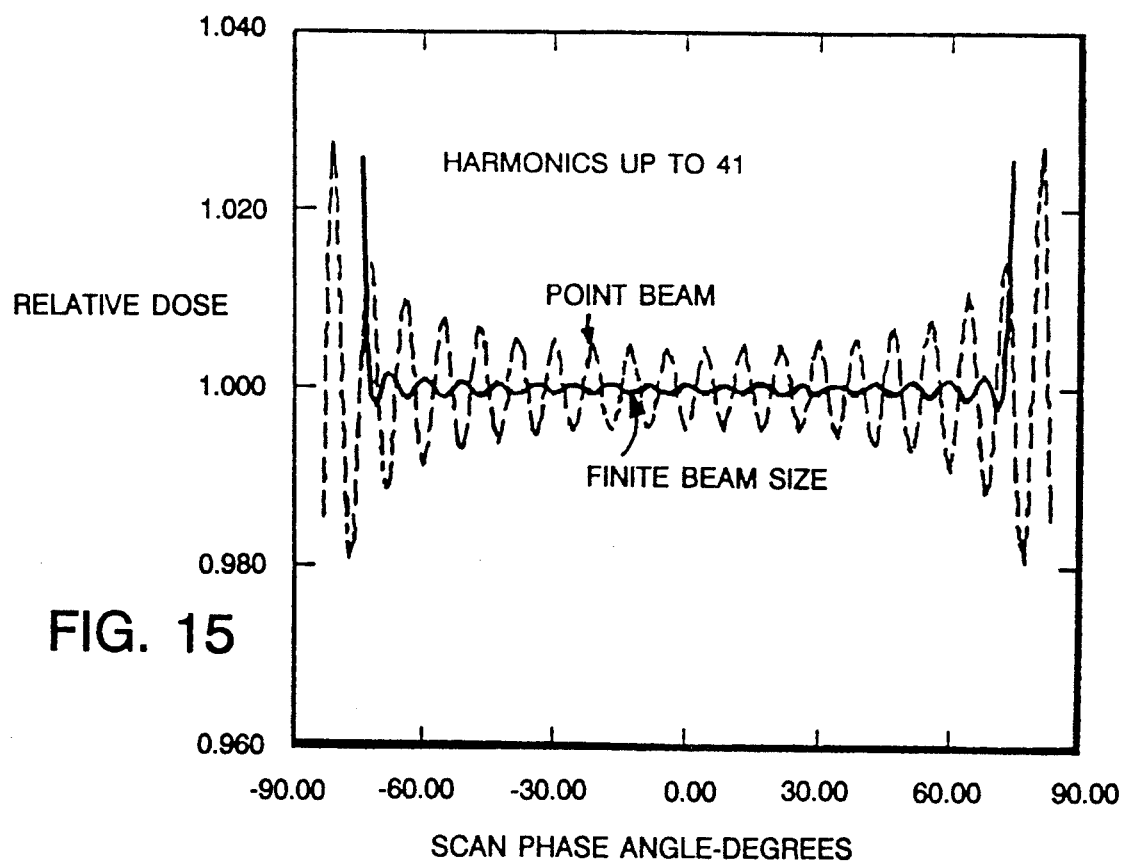

In practice, both the power amplifier 102 and the scanner magnet 2 have a finite frequency response. Harmonic components above a certain frequency will not be transmitted to the coil current 66 as a result of the frequency response limitations in the power amplifier 102, nor to the magnetic field as a result of the frequency response limitations of both the power amplifier 102 and the scanner magnet 2. However, as shown in FIGS. 14 and 15, truncating the frequency components in the Fourier series to include only those below approximately 20–40 kHz leads only to a slightly rounded sawtooth, as illustrated in FIG. 14. The frequency response of the scanner magnet 2 has been previously discussed, and is illustrated in FIGS. 8 and 9. Commercially available power amplifiers have two limitations which prevent them from generating a perfect sawtooth waveform. One is their intrinsic frequency bandwidth capability, and the other is that to generate a sawtooth waveform requires a voltage to be delivered to the magnet coil that is approximately of a square wave shape, as shown in the reference signal 130, of FIG. 13. The square wave shape has the characteristic that at the end of a scan half-period, the voltage must be suddenly reversed in magnitude. Commercial power amplifiers always have a limited voltage slew rate, a limit to the rate at which that voltage can be reversed. During the time the voltage is being reversed, the beam is in the overscan position on the target, so the precise waveform is no longer important. The highest possible slew rate is desirable. Commercial amplifiers at this time have slew rates of approximately 40 μsec from a full positive voltage to a full negative voltage, which is a small fraction of the scan period of about 2000 μsec for scan frequencies up to 500 Hz.

The power amplifier 102 must be capable of exciting highly inductive loads, such as in a scanner or compensator magnet, with very high efficiency and very little internal power loss. (Techron, Elkhart, Ind. and Copley Controls Corp., Newton, Mass. commercially offer such power amplifiers. However, the pulse width modulated operation of these amplifiers generates a high frequency ripple in the voltage output of typical frequency of 40–80 kHz and of typical magnitude of 1–3%. Ripple voltage applied across the coils from this source directly generates a ripple in the dose uniformity according to Eqs. (21) and (22). However, because the beam has a finite size at the target, and because this ripple frequency is much greater than the scan frequency, typically by two orders of magnitude, the ripple in the dose uniformity is greatly attenuated. Just as the fluctuations in dose uniformity from a limited number of higher order harmonics are greatly attenuated by the finite beam width as illustrated in FIGS. 14 and 15, the same is true for the ripple component arising from voltage ripple in the power amplifier. Indeed, for ripple voltage amplitudes as high as 3%, and typical beam width sizes corresponding to a scan phase angle range of 15°, the effect of the ripple on dose uniformity is much less than 0.1%.

Even if the beam at the target were focused to be point-like in nature (a condition not employed in ion implantation), then in a single scan across the surface of the wafer the ripple associated with the power amplifier 102 and the fluctuations associated with the limited number of harmonics in the waveform as a result of the bandwidth limitations of the power amplifier 102 would be evident in the dose uniformity. But even then, after several scan cycles the ripple is greatly attenuated by pre-selection of the scan frequency so that the ripple frequency is not an integral multiple of the scan frequency.

Figure 17:
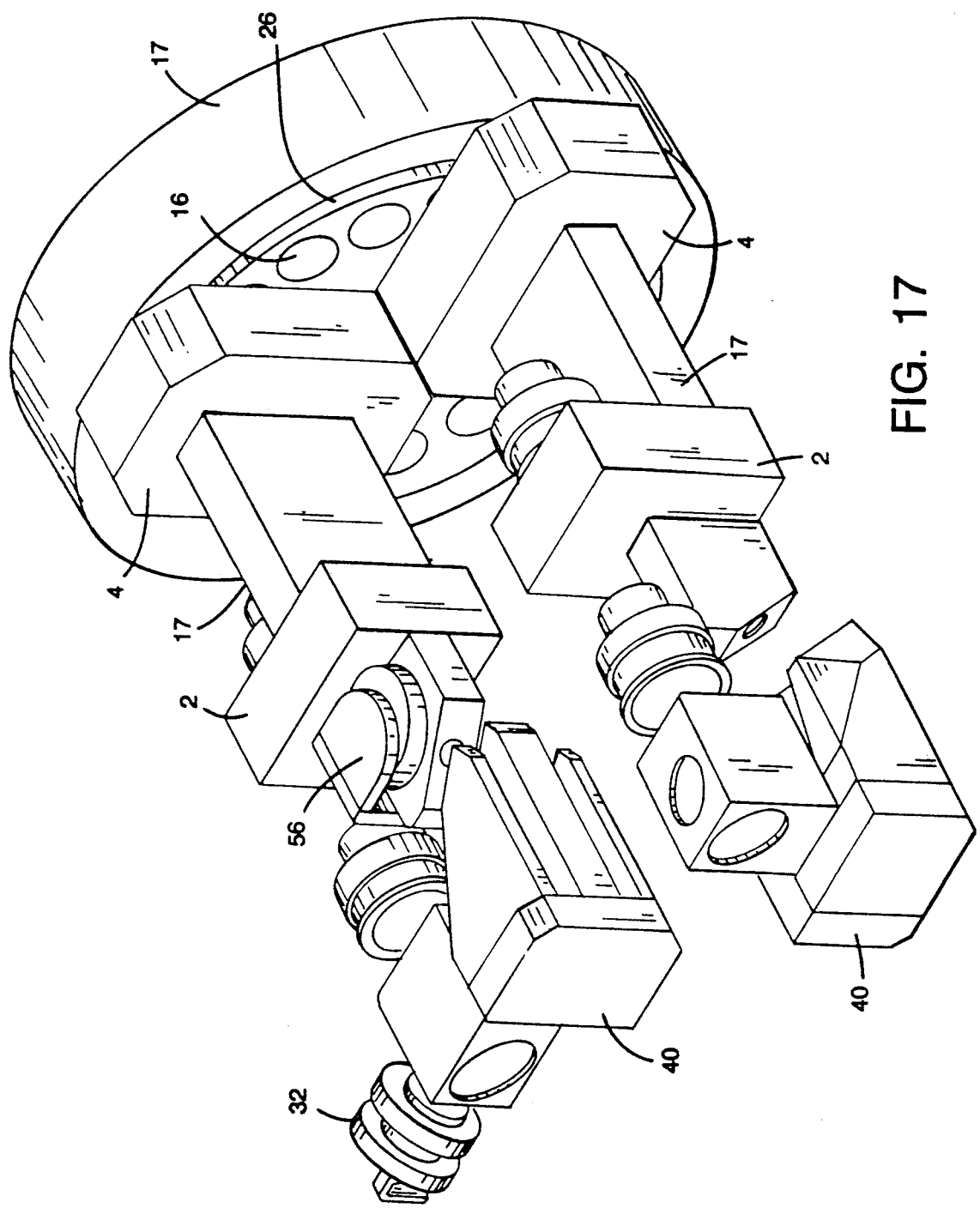
FIG. 17 illustrates the general configuration of two beam lines in a four beam line implanter.

In one application of the preferred embodiment the invention is a high current (50–200 mA) oxygen ion beam implanter used in the SIMOX process (separation by implantation of oxygen). The implanter can achieve high current high throughput oxygen ion implantation with a uniform dose within 1% across a Si wafer. The total oxygen dose required for the SIMOX process is in the range of $3 \times 10^{17}$ to $2 \times 10^{18}$ ions/cm$^2$. The optimal implantation energy is about 200 keV, which produces a layer of silicon oxide buried to a depth of 2000 Å ±25 Å below the surface of the silicon wafer for a dose of $2 \times 10^{18}$ ions/cm$^2$. A lower dose in general increases the depth. If a less deep layer of oxide is desired, the implantation energy is decreased by adjusting the acceleration voltage on the post-accelerator 48 of FIG. 1. The Si wafers are mounted on the carousel 26 (see FIG. 1) rotating with the angular velocity between 50 RPM and 200 RPM. The scanning frequency of the magnetic scanning system is between 50 Hz and 150 Hz to avoid thermal pulsing. The scan is parallel to better than 1.0°, a degree of accuracy that allows the wafers to be oriented such as to either utilize or eliminate the channeling effect in the silicon wafer and in turn provide further control of the depth of the buried oxide layer. The high implantation energy and high beam current combined, transfers a large amount of power to a desired value of the wafers, which in turn heats the wafers to about 1000° K. With a scanning frequency of the beam above 50 Hz the temperature uniformity is 10° to 20° K across the wafer during implantation. To regulate the implantation temperature, an additional heater can be used to heat the wafers mounted on the carousel. A greater level of heating is also achieved by using multiple beam lines with a single carousel, as shown in FIG. 17 and as described in greater detail later. The scan amplitude can be set large enough to implant wafers up to 12 inches in diameter.

A related process SIMNI (Separation by implantation of nitrogen) requires a similar machine but nitrogen rather than oxygen ions are used to create the buried insulator.

EXAMPLE OF THE OPERATION AND PERFORMANCE OF THE PREFERRED EMBODIMENT

Consider one application of the preferred embodiment suitable for the SIMOX process just described above. Referring to FIG. 1, an ECR source (described in *The Physics and Technology of Ion Sources*, Ed. Ian G. Brown, John Wiley & Sons, New York 1989) produces 50 to 100 mA of monatomic oxygen ions in the energy range of 40 to 70 keV. The source plasma slit 34 is 40 mm high by 3 mm wide. The analyzer magnet 40 has a bending radius of 320 mm, a bending angle of 105°, and a clearance gap of 55 mm. The magnetic field strength is variable up to 5 kG, sufficient to bend a 70 keV oxygen ion beam. The pole profiles of the analyzer magnet 40 are selected to produce a ribbon shaped beam at the entrance of the post-accelerator 48 using well-known art as described by H. A. Enge in *Deflecting Magnets* (published in *Focusing of Charged Particles*, VII, Ed. A. Septier, Academic Press, New York 1967).

Referring to FIG. 18 the size of the beam at the entrance to the accelerator gap is $\Delta X \simeq 10$ mm and $\Delta Y \simeq 30$ mm in the x- and y-directions respectively. The post-accelerator gap has slot-shaped electrodes as shown in FIG. 1c, and the beam upon emerging from the post-accelerator, diverges in both the x and the y directions, after experiencing x focusing from the electric field gradient, plus x- and y-defocusing from space charge forces, as previously described for the preferred embodiment. The energy of the beam after acceleration is adjustable from 100 to 200 keV (corresponding to an initial energy of 40 to 70 keV). Again, as previously described, the post-accelerator magnet 56 of FIG. 1 and 1a preferentially focuses the beam in the y-direction, as shown in FIG. 18. The data in FIG. 18 corresponds to a post-accelerator magnet having a bending radius of 320 mm, a bending angle of 30°, and a field of 8.1 kG (for 200 keV oxygen), and entrance and exit fringing field angles α (defined in FIG. 1b) of 21°. At the wafer, a distance of 2 m downstream from the entrance to the post-accelerator gap, the beam size is $\Delta X \simeq 95$ mm and $\Delta Y \simeq 46$ mm. For a beam current of 75 mA, this corresponds to a current density of approximately 2 mA/cm$^2$ which is small enough to avoid degradation during implantation from local thermal pulsing, wafer charging, and sputtering. When the fringing field angle α of the post-accelerator magnet is increased from 21° to 23° there is stronger y-focusing as previously described and, at the wafer, the y-beam size becomes halved while the x beam size barely changes, as shown in FIG. 19. The variation of the beam size with the spacing 45 between the first 51 and last 52 electrode of the post-accelerator 48 (see FIG. 1b) is shown in FIG.

20. In summary, the data in FIGS. 18, 19, and 20 emphasize the great utility and advantageous features of the preferred embodiment with regard to controlling the beam size at the wafer, in order to minimize the extent of the over-scan region by having a small y-dimension, and yet maintaining a large enough beam area in order to avoid thermal pulsing and other degrading effects accompanying high power density beams.

FIG. 21 shows the relative locations, and the contours of the effective field boundaries of the scanner 2 and compensator 4. The incident beam axis 10 is 731 mm from the carousel axis 28. The principal axes 12 of the beam deflections at equally spaced time intervals over one half of an oscillatory period, are also shown in FIG. 21. The magnets operate at a frequency of 150 Hz and the compensator is excited in a resonant mode as shown in FIG. 11. The scanner and compensator have cross-laminated structures of the types shown in FIGS. 5b and 5a respectively, with cooling plates on the pole laminations as well as the yoke laminations. The pole gap in the scanner is 38 mm and the pole width steps from 110 m at the entrance to 160 mm at 140 mm from the entrance boundary. The exit pole boundary is 300 mm from the entrance and has a convex curvature of 3 $m^{-1}$ (i.e. 0.33 m radius). The entrance pole boundary of the compensator 4 is concave to provide a parallel scan with radial compensation as described by Eq. (17). The radial correction for uniform irradiance, requires a higher scan velocity at smaller radii than at large radii, and is evident in FIG. 21 by the wider spacing between adjacent principal axes 12 at the smaller radii. The length of the pole root of the compensator is 244 mm. The pole gap of the compensator is 100 mm and the pole width is 600 mm. The maximum deflections shown in FIG. 21 are 9.3° outwards from the carousel axis 28 and 12.4° inwards to the carousel axis, producing a parallel scan at the wafer from R=490 mm to 910 mm, which is sufficient to scan over a 300 mm (12 inch) wafer, and have 60 mm of over-scan at the extremities. For a 200 keV oxygen beam and a frequency of 150 Hz, the scanner is excited to 12 kVA with a peak field of 1.93 kG, and the compensator is excited to 150 kVA with a peak field of 1.5 kG. In the case when the lamination material is 0.35 mm thick grain oriented M6 silicon steel (manufactured by TEMPEL STEEL, Niles, Ill.) the core and resistive losses in the scanner and compensator are approximately 1 and 6 kW respectively. If the contour of the entrance pole boundary of the compensator is a best fit parabola to rather than an exact solution of Eq. 17, then the scan is parallel to better than ±0.3° over the range R=560 to 860 mm.

Referring to FIG. 22, the waveforms necessary to produce a uniform irradiance over the scan range, are plotted against the phase $\phi = 2\pi ft$ of the sinusoidal field in the compensator (see Eq. 7). The field $B_1$ waveform 191 of the scanner is a more or less triangular wave with the following polynomial dependence on $\phi$:

$$B_1(t) = 1.1535\phi(1 - 0.08579\phi - 0.02008\phi^2 - 0.00053\phi^3 - 0.00314\phi^4 + 0.00036\phi^5) \quad (25)$$

where $\phi$ is in radians, $(-\pi/2 \leq \phi \leq \pi/2)$, and $B_1$ is in kG. The coefficients in this polynomial have been derived from Eqs. 10, 11, and 12, using the specific pole boundaries of the scanner and compensator. Of course, other pole boundaries and/or scan ranges would result in a different set of coefficients in the polynomial expansion of B. FIG. 22 shows the derivative 193 dB/dt of B, which is a modified square wave that finally produces the radially corrected scan velocity 195 (and uniform irradiance), also shown in FIG. 22.

Figure 23:
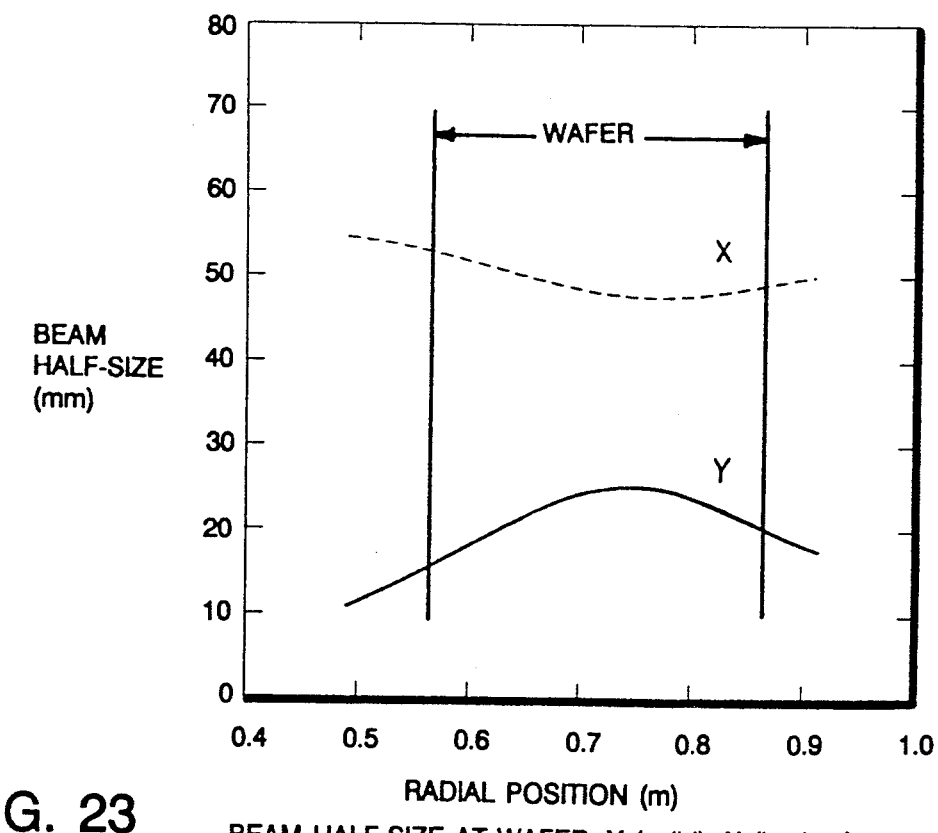
FIG. 23 shows the variation in beam size at the wafer with radial position over the scan range in the SIMOX application of the preferred embodiment.

FIG. 23 shows the variation of the beam size in the x- and y-directions as the beam scans across the wafer. The variation of the x-beam size is less than ±5% over the wafer. The variation in the y-beam size is ±25% but this is less critical because the y-direction is the high velocity scan direction.

Figure 24:
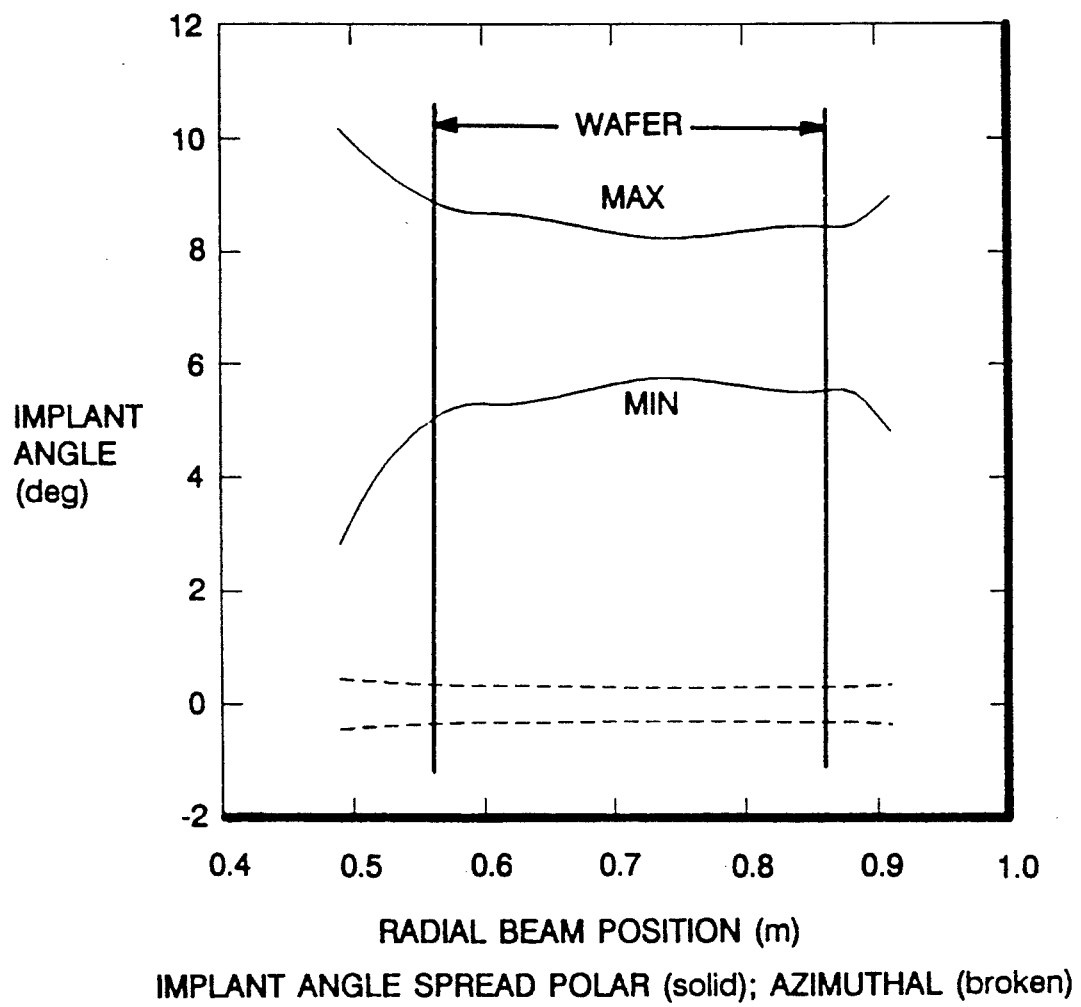
FIG. 24 shows the variation in implant angle with radial position over the scan range in the SIMOX application of the preferred embodiment.

FIG. 24 shows the variation in the implant angle as the beam scans across the wafer, for the case when the wafer is tilted at 7° to avoid channeling, as shown in FIG. 2. The spread in implant angle arises from the angular deviation within the beam which is always finite because in practice the beam has a non-zero emittance that causes it to diverge and expand in the x-direction as it travels from the scanner to the wafer, as shown in FIG. 2a. Nevertheless, over the region of the wafer the polar angle deviates by a maximum of 2°, and the azimuthal angle by less than 0.4°, both of which are sufficiently small to avoid channeling.

An important feature of the invention is the lateral compactness of the entire embodiment, from the ion source to the compensator. This enables more than one beamline to be arranged around the carousel. Indeed, the beam line described above, with the beam axis 10 displaced 731 mm from the carousel axis 28, as shown in FIG. 21, permits up to 4 beam lines to be positioned at 90 degree intervals around the carousel axis, as shown in FIG. 17 (for clarity only two of the possible 4 beam lines are shown). Another possibility is to use two beam lines 180 degrees apart. In this case, the distance of the axis from the carousel can be reduced to 650 mm. The advantage of using multiple beam lines is the higher throughput that can be realized. The additional beam power also makes it easier to maintain the wafer temperature at 1000° K during implantation, a requirement of the SIMOX process as previously described.

SECOND PREFERRED EMBODIMENT

Figure 1E:
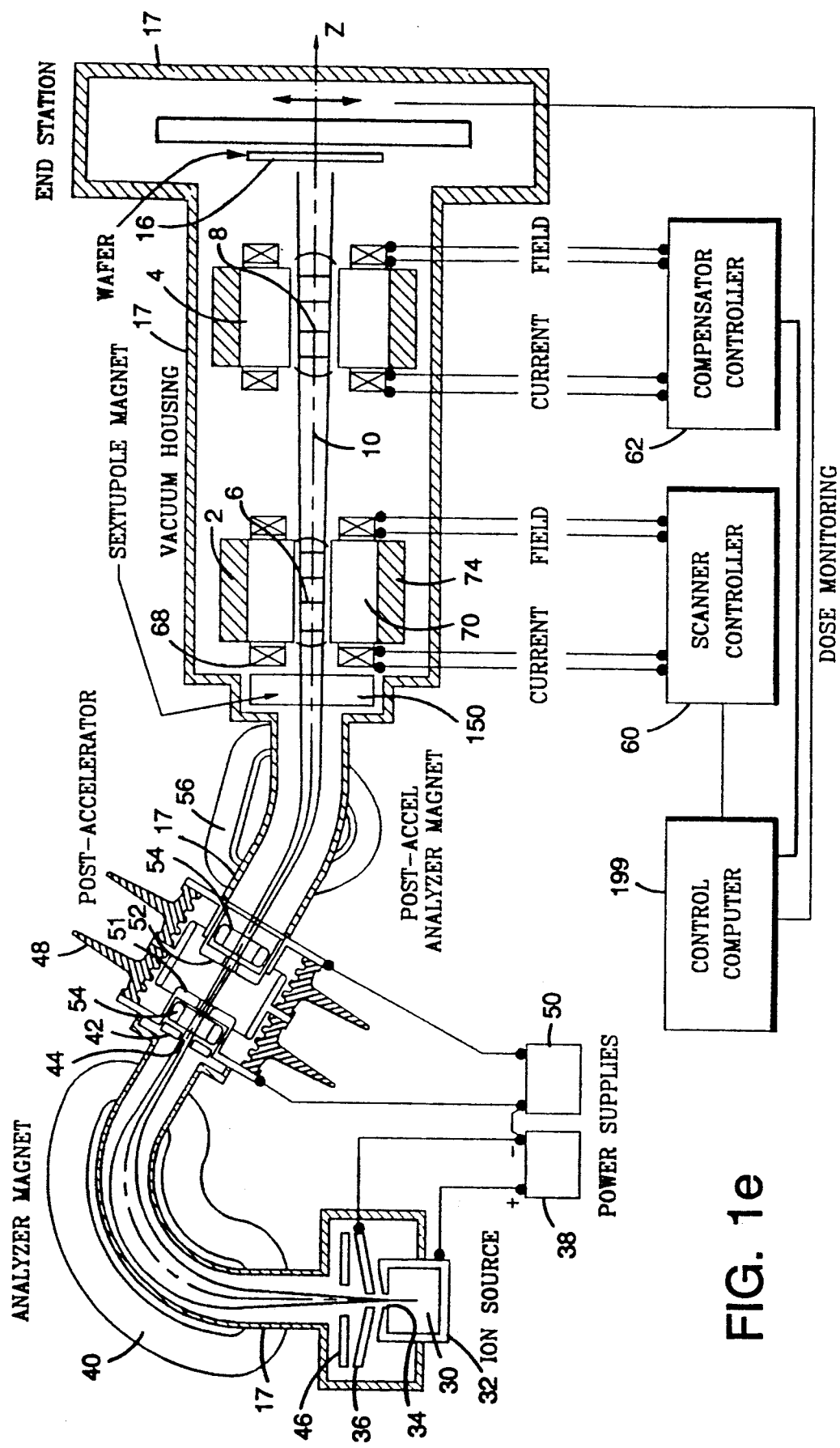
FIG. 1e is a diagrammatic general representation of a preferred ion beam magnetic scanning system according to the invention with a target substrate that reciprocates in a direction orthogonal to the magnetic scanning direction.

In another application, the preferred embodiment is a serial ion implanter having means to introduce one wafer at a time to the process rather than a batch of wafers mounted on a carousel 26 as shown in FIG. 1. Such an implanter is generally used for doping silicon wafers with boron, phosphorous, arsenic, or antimony. Very often beams of high current, but relatively low energy, down to 5 keV are used. For this reason the power dissipation is low enough to avoid the need to spread the beam power over a batch of wafers. On the other hand, the beam perveance is high and the features of the preferred embodiment of a very high scan frequency, and the absence of space charge blow up are advantageous for such a serial implanter. While the scanning system according to the invention, described above, is used to scan the beam in one direction across the wafer. The other direction of scan is preferably achieved by mechanical reciprocation, as shown in FIG. 1e. In this case, there is no need to radially compensate the magnetic scan as is necessary with a rotating carousel, and accordingly the excitation wave and magnetic structures are symmetrical about the respective axes. To obtain a uniform irradiance down trenches in the wafer surface the wafer may be rotated about a central axis nominal to its surface, as well as reciprocated.

ALTERNATIVE EMBODIMENTS

Figure 16:
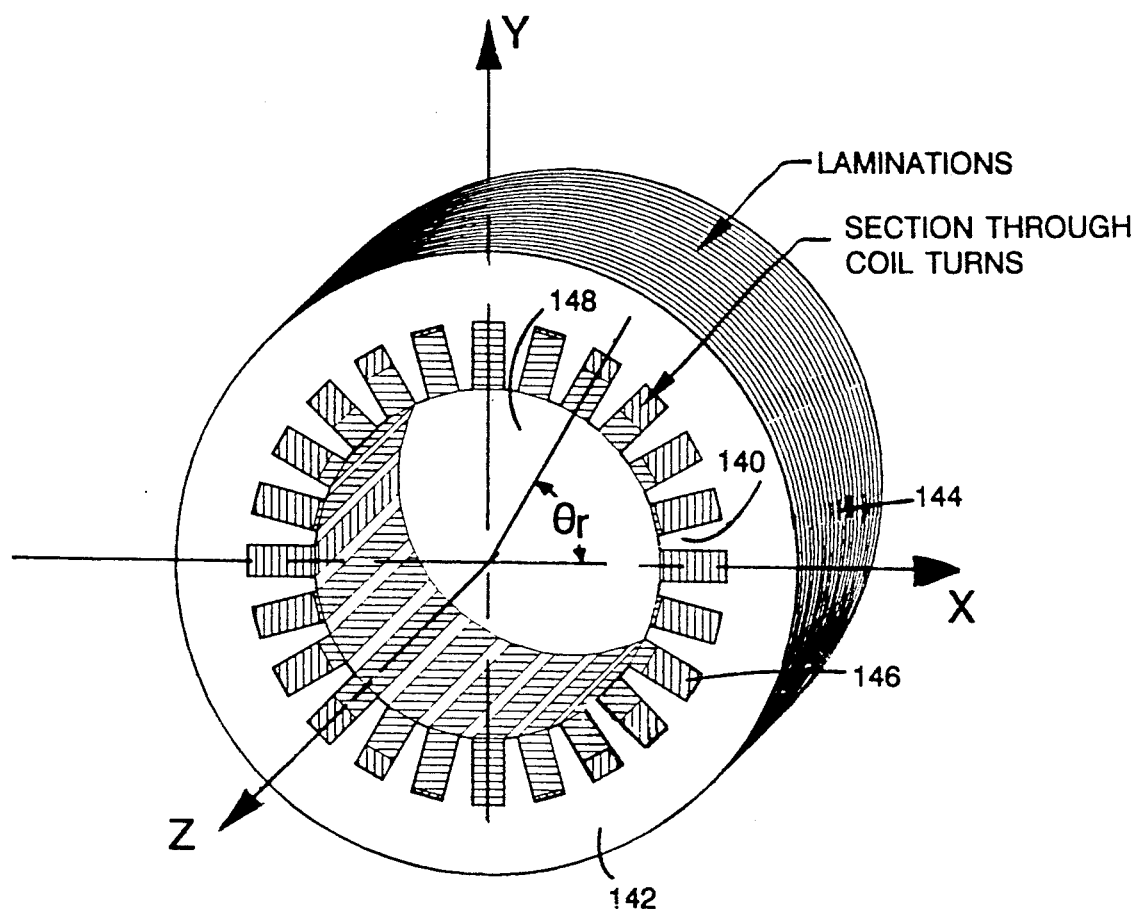
FIG. 16 is a perspective view of an alternative magnetic structure useful according to certain broad aspects of the invention.

FIG. 16 shows an alternative embodiment for the two scanner magnet wherein there are a multiplicity of poles 170, all magnetically connected through a yoke 172. In order to reduce eddy currents, both the yoke 172 and the poles 170 are composed of ferromagnetic laminations 172. There are an even number of poles located in the x-y plane, at equally spaced angles $\theta_1$, $\theta_2$, $\theta_n$, and if the number of turns of the coil 176 located on the pole at angle $\theta_r$ is proportional to the absolute value of sin $\theta_r$, then when all such coils are connected in series and excited, an oscillatory magnetic field is generated in the x-direction in the gap 178, which in turn, produces a y-deflection of an ion beam travelling in the z-direction.

In another embodiment, the magnetic structures of the scanner or the compensator can be fabricated partially or completely of ferrites.

In another embodiment, it is possible to place both the scanner magnet and the compensator magnet outside the vacuum housing. In this embodiment, sections of the vacuum housing located in the magnetic gap of the scanner or the compensator can be made of a nonmagnetic material (e.g., stainless steel) or an insulator so that the magnetic field is not disturbed in any way. If the vacuum housing is made of a material that is an electrical conductor, then the chamber must be appropriately laminated to reduce eddy currents to a tolerable level. This arrangement prevents the large magnetic structures with large area epoxy surfaces) from contaminating the contaminate high vacuum conditions inside the ion implanter. In general, it is desirable to maintain a high vacuum in the ion implanter to prevent undesirable change exchange processes of the ion beam. This is particularly important for implantation of boron where molecular ion species $BF^+$, $BF_2^+$ or $BF_3^+$ are sometimes used.

While the invention is particularly useful for implanting with high ion beam currents, and in particular oxygen ions for production of an insulating barrier buried in a semiconductor substrate, it is also useful for doping general substrates and many other applications.

What is claimed is:

1. A magnetic scanning system for rapidly sweeping a high perveance beam of atomic or molecular ions over a selected surface, said beam initially propagating in a predetermined direction, said scanning system comprising
    a magnetic scanning structure and an associated scanning excitation circuit for repeatedly sweeping said ion beam in one dimension in response to an oscillating magnetic field having a fundamental frequency and higher order harmonics induced by excitation current from said circuit, and
    a separate magnetic compensating structure and associated compensating excitation circuit spaced from said scanning structure along the beam axis, for continuously deflecting said ion beam after it has been swept by said scanning structure, to re-orient the beam to a direction substantially parallel to an output axis of said system,
    said scanning circuit and said compensating circuit having separate power sources having wave forms at the same fundamental frequency for their respective scanning and compensating functions, said circuits being in constant phase relationship with a predetermined phase angle difference.

2. The magnetic scanning system of claim 1 having means to produce different, complementary wave forms for said scanning and compensating circuits.

3. The magnetic scanning system of claim 1 in which the ratio of the lateral width of the gap at the entrance of said magnetic scanning structure to the gap spacing is of the order of 3 to 1.

4. The magnetic scanning system of claim 1 wherein the lateral width of pole pieces of said scanning structure and said compensating structure increase along the length of the beam axis to accommodate a progressively wider beam sweep.

5. The magnetic scanning system of claim 1 wherein said magnetic scanning structure comprises a plurality of laminations of high magnetic permeability material having thickness in the range between about 0.2 and 1 millimeter, said laminations being separated by relatively thin electrically insulating layers, said laminations forming a yoke connecting pole pieces that define a gap through which said ion beam passes, said laminations providing a low reluctance magnetically permeable path for said fundamental frequency and higher order harmonic components of said magnetic field, the laminations serving to confine induced eddy currents to limited values in local paths in respective laminations.

6. The magnetic scanning system of claim 2, 3, 4 or 5 wherein said magnetic compensating structure comprises a plurality of laminations of high magnetic permeability material having thickness in the range between 0.2 and 1 millimeter, the laminations being separated by relatively thin electrically insulating layers, said laminations forming a yoke connecting pole pieces that define a gap through which said ion beam passes, said laminations providing a low reluctance magnetically permeable path for said fundamental frequency of said magnetic field, the laminations serving to confine induced eddy currents to limited values in local paths in respective laminations.

7. The magnetic scanning system of claim 1 including means arranged to provide said high perveance ion beam with a ribbon-profile entering said scanning structure, said scanning structure arranged to deflect said ion beam in the long direction of said ribbon profile.

8. The apparatus of claim 1 wherein said compensating excitation circuit is constructed to operate in resonance with the fundamental frequency of oscillation of the previously deflected beam.

9. The magnetic scanning system of claim 8 further comprising a synthesizer for producing said fundamental frequency.

10. The system of claim 8 wherein said excitation circuit comprises
    excitation coils connected in series,
    a tank capacitance connected in parallel with said excitation coils,
    a coupling capacitance having a value related to the inductance of the circuit to achieve resonant operation, and
    a power amplifier driven by said fundamental frequency signal for delivering power to said circuit to compensate for the energy losses in said excitation circuit and said magnetic structure.

11. The magnetic scanning system of claim 1 further comprising means to drive said magnetic scanning structure by an excitation current of a generally triangular wave formed by said fundamental frequency and superimposed higher order harmonics, and means to drive said magnetic compensating structure by excitation current in resonance with said fundamental frequency.

12. The magnetic scanning system of claim 11 wherein said generally triangular wave form is selected to compensate for a component of scanning motion of the surface being irradiated.

13. The system of claim 11 or 12 including a dynamic feedback control comprising
    magnetic field detection means for detecting a magnetic field of said magnetic scanning system and producing signals representing said magnetic field and,
    a feedback control system for controlling the excitation current producing a prescribed magnetic field in a closed loop arrangement with the respective magnetic excitation circuit and magnetic field detection means.

14. The system of claim 13 wherein said field detection means comprise at least one inductive coil inside of said magnetic circuit.

15. The system of claim 14 wherein said feedback control system further comprises
    a signal conditioner connected to said inductive coil and adapted to eliminate circuitry-induced distortions of said detected signal by adjusting the gain and shape of said detected signal,
    a phase compensator adapted to receive said signal from said signal conditioner and to correct said detected signal for a phase shift arising from electronic delay times and finite permeability of the yoke material,
    a differential amplifier adapted to generate and to amplify an error voltage which is a difference between a reference signal and said detected signal conditioned and compensated by said conditioner and said compensator, respectively, and
    said power amplifier of said resonant excitation circuit adapted to receive said error voltage and generate excitation current to said excitation coil proportional to said error voltage to produce said prescribed magnetic field.

16. The magnetic scanning system of claim 13 including a respective said dynamic feedback control for each said magnetic scanning structure and said magnetic compensating structure.

17. The magnetic scanning system of claim 1 or 7 wherein said magnetic compensating structure comprises pole pieces having surfaces on the beam entry and exit sides of cooperatively selected shape to increase, dependently with deflection angle of the beam, the length of the ion beam path exposed to the force-field of said magnetic compensating structure to compensate for the contribution to said deflection angle caused by said higher order harmonics of said scanning structure excitation current so that said ion beam is re-oriented by said magnetic compensating structure to a direction substantially parallel to an exit axis of said magnetic compensating structure.

18. The magnetic scanning system of claim 1 or 8 wherein the surfaces on the beam entry and beam exit sides of said magnetic scanning structure and of said magnetic compensating structure are shaped in a predetermined cooperative relationship relative to the profile of said beam entering said system to establish cooperating magnetic fringing fields for both said magnetic structures that cooperate to produce a desired profile of said beam and desired limitation on the angular deviation of ions within said beam.

19. The magnetic scanning system of claim 1 having, prior to said magnetic scanning structure, an electrostatic-magnetostatic system for accelerating and focusing a high perveance beam of atomic or molecular ions comprising
    a set of acceleration electrodes forming an electrostatic accelerating system charged by a power source, said electrodes adapted to electrostaticly focus said ion beam in one dimension, said electrodes adapted to supply electrostatic energy to accelerate said ion beam in the direction corresponding to the potential difference across said electrodes,
    a suppressor electrode for maintaining electrons within said beam, said electrode having an aperture and being located at the exit port of the electrostatic accelerating system, and
    a post-acceleration analyzer magnet arranged to focus said beam in the other direction, said magnet having means for adjusting the angle of incidence of said ion beam into the entrance region of said post-acceleration magnet.

20. The magnetic scanning system of claim 19 wherein said electrodes form a slotted aperture, said electrodes adapted to focus said beam in the direction of the short dimension of said slotted aperture.

21. The magnetic scanning system of claim 19 and 20 including means arranged to provide said high perveance ion beam with a ribbon-profile entering said accelerating system, said accelerating system arranged to focus said beam in the short direction of said ribbon profile.

22. The magnetic scanning system of claim 19 or 20 wherein said set of acceleration electrodes comprises two relatively movable electrodes for electrostatic focusing of said ion beam.

23. The magnetic scanning system of claim 19 or 20 wherein said set of acceleration electrodes comprises three fixed electrodes adapted to electrostaticly focus said ion beam by varying the electric potential on the center electrode.

24. The magnetic scanning system of claim 19 or 20 wherein said means for adjusting the angle of incidence of said ion beam into the entrance region of said post-acceleration magnet comprises means for laterally moving said post-acceleration magnet relative to the beam path, thereby focusing said beam while removing neutral particles and ions of unwanted momentum ions from said ion beams.

25. The magnetic scanning system of claim 24 further comprising a multipole magnet with a static magnetic field arranged to eliminate aberration of said ion beam created by said post-acceleration analyzer magnet.

26. The system of claim 25 wherein said multipole magnet is a sextupole.

27. The system of claim 1 further comprising a reciprocating carrier for repeatedly carrying said selected surface mounted on said carrier under said beam to effect scanning in one dimension,
    said magnetic scanning system arranged for rapidly sweeping said ion beam in the orthogonal dimension.

28. The system of claim 1 further comprising
    a driven rotatable carrier for repeatedly carrying said selected surface mounted on said carrier under said beam to effect scanning in one dimension,
    said magnetic scanning system arranged for rapidly sweeping said ion beam in the radial direction of said rotatable carrier to effect scanning in the other dimension, and means for producing said excitation wave form applied to said magnetic scanning system to govern its sweeping action, the functional dependence of said excitation wave form relating changes in the scan velocity in inverse dependence with change in the radial distance between the instantaneous location of the center of the beam and the axis of rotation of said rotatable carrier.

29. The system of claim 1 including a focusing device for determining the dimension of the beam in the direction of magnetic scanning and normal thereto.

30. The system of claim 29 wherein said focusing device comprises an adjustable accelerator having slotted apertures, the narrow dimension of the apertures corresponding to the direction normal to the magnetic scanning dimension.

31. A method of rapidly sweeping over a selected surface a high perveance beam of atomic or molecular ions initially propagating in a predetermined direction, comprising the steps of:

(a) introducing said ion beam to a magnetic scanning structure, (b) sweeping said ion beam in one dimension by an oscillating magnetic field having a fundamental frequency of at least 20 Hz and higher order harmonics induced by a scanning excitation current generated by a scanning excitation circuit, to produce a constantly changing deflection angle and (c) continuously re-deflecting said deflected ion beam using a separate magnetic compensating structure to re-orient said ion beam to a direction substantially parallel to an exit axis of the compensating structure by driving said magnetic compensating structure with a compensating excitation current having the same fundamental frequency as said scanning excitation current, said compensating excitation current being generated by a separate compensating circuit operating in a phase-locked mode with said scanning excitation circuit.

32. The method of claim 31 including generating said compensating excitation current in resonance with said fundamental frequency of said scanning excitation current.

33. The method of claim 32 wherein the length of the ion beam path exposed to the force-field of said magnetic compensating structure is varied to compensate for the contribution to said deflection angle caused by higher order harmonics of said scanning excitation current.

34. A method of implanting a uniform dose of oxygen ions into a silicon wafer to form a buried oxide layer, using an ion implantation system, comprising the steps of:

(a) accelerating a high perveance oxygen ion beam of above 50 mA current to energy above 100 keV, (b) rotating said silicon wafer mounted on a carrier at above 50 rpm, (c) with a magnetic scanning system, scanning said ion beam in the radial direction of said carrier at a frequency above 50 Hz while maintaining a substantially constant incident angle of said beam to the surface of said silicon wafer, (d) controlling said system to obtain substantially uniform dose across the wafer under substantially uniform temperature conditions, said scanning step including deflecting said beam in an oscillating pattern using a magnetic scanner drive by a substantially triangular wave form and said controlling said system including applying compensating magnetic fields to reorient the deflected beam to a desired direction, said compensating step being performed with a dynamic magnetic deflecting compensator system driven at the same frequency in phase locked relationship with said scanning.

35. The method of claim 34 wherein said compensator is driven in resonance with said scanning.

* * * * *

UNITED STATES PATENT AND TRADEMARK OFFICE
CERTIFICATE OF CORRECTION

PATENT NO. : 5,311,028
DATED : May 10, 1994
INVENTOR(S) : Hilton F. Glavish

Page 1 of 2

It is certified that error appears in the above-indentified patent and that said Letters Patent is hereby corrected as shown below:

Title page, page 2,
In the references cited section, "4,376,477" should be --4,276,477--;

Please add the following reference:

JP 62-88246 published 04/22/87

Col. 7, line 19, delete "both";

Col. 7, line 47, after "entrance" insert --and exit--; change "region" to --regions--;

Col. 17, line 5, delete "82";

Col. 24, line 27, after "is" insert --proportional to the rate of change of the flux linkages--;

UNITED STATES PATENT AND TRADEMARK OFFICE
CERTIFICATE OF CORRECTION

PATENT NO. : 5,311,028
DATED : May 10, 1994
INVENTOR(S) : Hilton F. Glavish

It is certified that error appears in the above-indentified patent and that said Letters Patent is hereby corrected as shown below:

Col. 26, line 24, after "circuit" insert a comma;

Col. 29, line 22, change "m" to --mm--.

Signed and Sealed this

First Day of April, 1997

BRUCE LEHMAN

Attest:

Attesting Officer

Commissioner of Patents and Trademarks